(12) United States Patent
Cheng

(10) Patent No.: US 9,576,906 B2
(45) Date of Patent: Feb. 21, 2017

(54) METHODS RELATED TO A SPUTTERED TITANIUM TUNGSTEN LAYER FORMED OVER A COPPER INTERCONNECT STACK STRUCTURE

(71) Applicant: Skyworks Solutions, Inc., Woburn, MA (US)

(72) Inventor: Kezia Cheng, Lowell, MA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 15/224,993

(22) Filed: Aug. 1, 2016

(65) Prior Publication Data

US 2016/0343667 A1    Nov. 24, 2016

Related U.S. Application Data

(62) Division of application No. 13/774,988, filed on Feb. 22, 2013, now Pat. No. 9,443,803.

(Continued)

(51) Int. Cl.
*H01L 29/06* (2006.01)
*H01L 23/532* (2006.01)
(Continued)

(52) U.S. Cl.
CPC ... *H01L 23/53238* (2013.01); *H01L 21/76816* (2013.01); *H01L 21/76843* (2013.01); *H01L 21/76852* (2013.01); *H01L 21/76895* (2013.01); *H01L 21/8252* (2013.01); *H01L 23/5283* (2013.01); *H01L 23/535* (2013.01);
(Continued)

(58) Field of Classification Search
CPC . H01L 29/868; H01L 23/532; H01L 23/53238
See application file for complete search history.

(56) References Cited

U.S. PATENT DOCUMENTS 4,109,297 A    8/1978 Lesh et al.
5,497,033 A    3/1996 Fillion et al.
(Continued)

FOREIGN PATENT DOCUMENTS

JP    2006-032888 A    2/2006
JP    2009-277852       11/2009
(Continued)

OTHER PUBLICATIONS

PCT Search Report and Written Opinion re International Application No. PCT/US2013/026953 dated Jun. 21, 2013, in13 pages.
(Continued)

*Primary Examiner* — Samuel Gebremariam
(74) *Attorney, Agent, or Firm* — Knobbe Martens Olson and Bear LLP

(57) ABSTRACT

Disclosed are devices and methods related to metallization of semiconductors. A metalized structure can include a stack disposed over a compound semiconductor, with the stack including a barrier, a copper (Cu) layer disposed over the barrier, and a first titanium (Ti) layer disposed over the Cu layer. The metalized structure can further include a sputtered titanium tungsten (TiW) layer disposed over the first Ti layer. The barrier can include an assembly of titanium nitride (TiN) and Ti layers. The metalized structure can further include a second Ti layer disposed over the sputtered TiW layer.

20 Claims, 17 Drawing Sheets

Related U.S. Application Data

(60) Provisional application No. 61/602,886, filed on Feb. 24, 2012.

(51) Int. Cl.
*H01L 21/8252* (2006.01)
*H01L 21/768* (2006.01)
*H01L 23/535* (2006.01)
*H01L 23/528* (2006.01)
*H01L 23/66* (2006.01)
*H01L 27/06* (2006.01)

(52) U.S. Cl.
CPC .......... *H01L 23/66* (2013.01); *H01L 27/0605* (2013.01); *H01L 2223/6677* (2013.01)

(56) References Cited

U.S. PATENT DOCUMENTS

| | | |
|---|---|---|
| 5,622,895 A | 4/1997 | Frank et al. |
| 5,831,276 A | 11/1998 | Gonzalex et al. |
| 6,380,626 B1 | 4/2002 | Jiang |
| 7,910,945 B2 | 3/2011 | Donofrio et al. |
| 2004/0180551 A1 | 9/2004 | Biles et al. |
| 2004/0203230 A1 | 10/2004 | Usami |
| 2004/0222525 A1 | 11/2004 | Rhodes et al. |
| 2005/0167837 A1 | 8/2005 | Cheng et al. |
| 2006/0103020 A1 | 5/2006 | Tong et al. |
| 2006/0292785 A1 | 12/2006 | Chang et al. |
| 2008/0265413 A1 | 10/2008 | Chou et al. |
| 2009/0194846 A1 | 8/2009 | Chang et al. |
| 2010/0078819 A1 | 4/2010 | Shin et al. |
| 2010/0164105 A1 | 7/2010 | Onai et al. |
| 2010/0244263 A1 | 9/2010 | Lin |
| 2011/0049720 A1 | 3/2011 | Jordan |
| 2011/0270341 A1 | 11/2011 | Ruben et al. |
| 2011/0284890 A1 | 11/2011 | Kim et al. |
| 2013/0221528 A1 | 8/2013 | Cheng |
| 2013/0228924 A1 | 9/2013 | Cheng |
| 2013/0234333 A1 | 9/2013 | Cheng |
| 2013/0240927 A1 | 9/2013 | Nunotani et al. |

FOREIGN PATENT DOCUMENTS

| | | |
|---|---|---|
| KR | 10-1999-0063767 A | 7/1999 |
| KR | 10-2010-0073779 A | 7/2010 |
| WO | WO 2011-099934 A1 | 8/2011 |
| WO | WO 2013-126458 | 8/2013 |

OTHER PUBLICATIONS

Chinese Office Action dated Mar. 3, 2016 for Chinese Patent Application No. 201380016231.5.

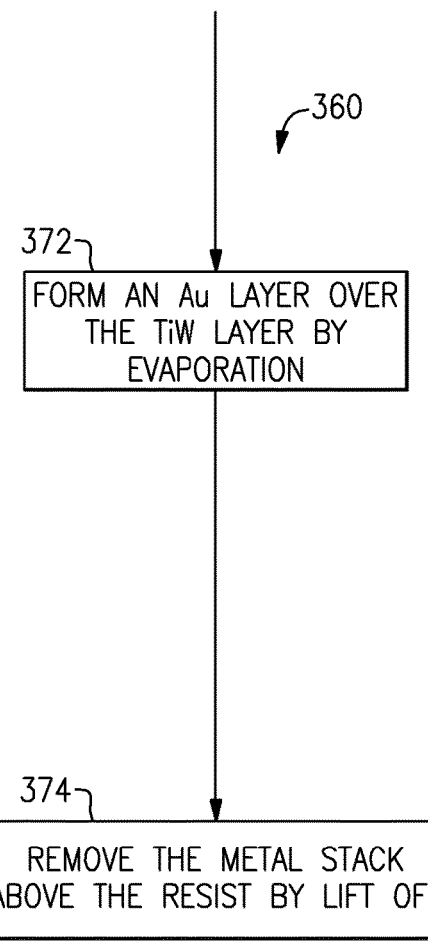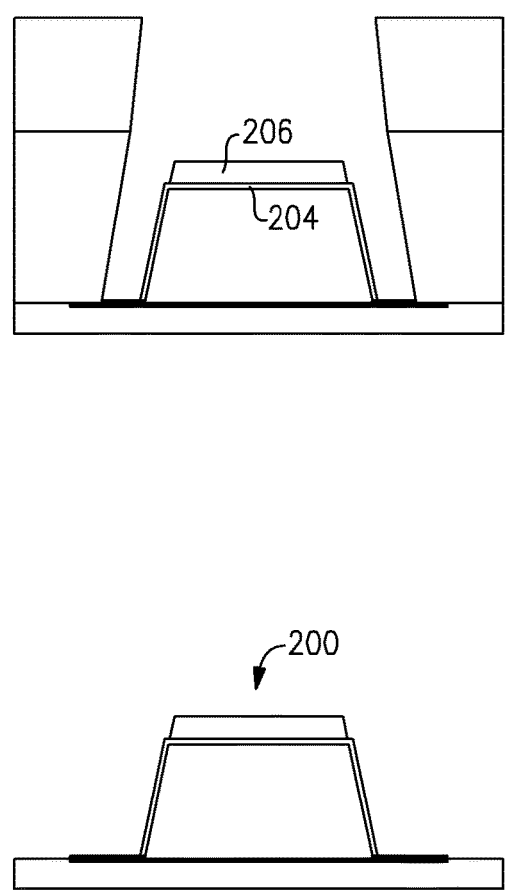
FIG.17B
FIG.18B

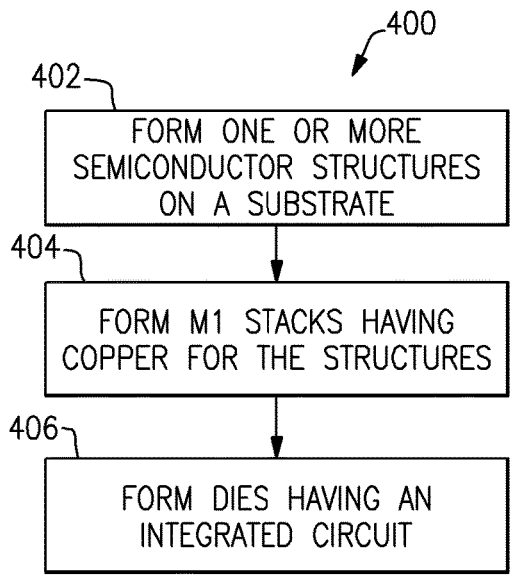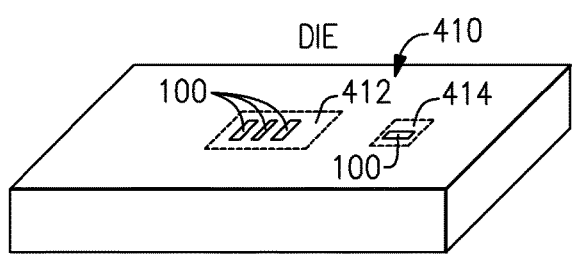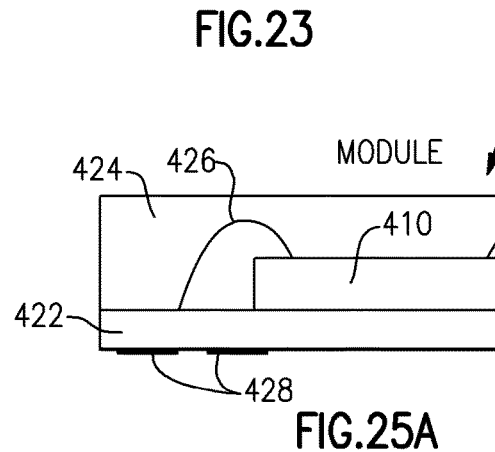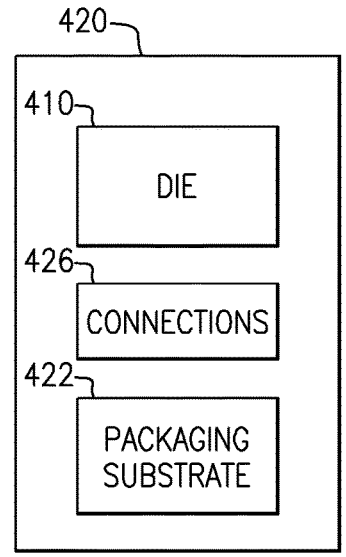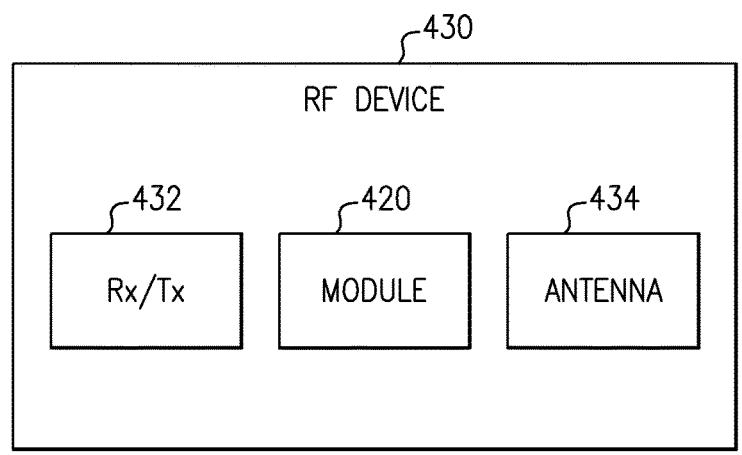

METHODS RELATED TO A SPUTTERED TITANIUM TUNGSTEN LAYER FORMED OVER A COPPER INTERCONNECT STACK STRUCTURE

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND

Field

The present disclosure generally relates to devices and methods related to copper interconnects for compound semiconductors.

Description of the Related Art

Compound semiconductor devices use metals such as gold to form interconnecting lines such as bus lines. These interconnects are commonly referred to as Metal 1, Metal 2 and Metal 3. Metal 1 or M1 typically refers to a first layer of metal interconnects that contacts, for example, ohmic metals and other active and/or passive components (e.g., resistors, capacitors and inductors) associated with integrated circuits. Metal 2 or M2 typically refers to a layer that connects to the M1. Metal 3 or M3 typically refers to, for example, a heat spreader in devices such as power amplifiers.

Gold is selected for some or all of the foregoing applications due to its properties such as low electrical resistivity, chemical inertness and desirable wire bonding properties. However, the price of gold is relatively high, thereby increasing costs associated with fabrication of compound semiconductor devices.

SUMMARY

In some implementations, the present disclosure relates to a metalized structure for a compound semiconductor device. The structure includes a first titanium (Ti) layer disposed over a substrate associated with the compound semiconductor device. The structure further includes a first barrier layer disposed over the first Ti layer. The structure further includes a second Ti layer disposed over the first barrier layer. The structure further includes a copper (Cu) layer disposed over the second Ti layer, with the second Ti layer being configured to inhibit alloying of the Cu layer and the barrier layer.

In some embodiments, the first Ti layer, the first barrier layer, and the second Ti layer can be configured to yield a barrier between the Cu layer and an ohmic metal layer formed on the substrate. In some embodiments, the first barrier layer can include platinum (Pt), palladium (Pd), or nickel (Ni).

In some embodiments, the structure can further include a third Ti layer disposed over the Cu layer and a second barrier layer disposed over the third Ti layer. The second barrier layer can include platinum (Pt), palladium (Pd), or nickel (Ni). In some embodiments, first barrier layer can be in direct contact with the first Ti layer, the second Ti layer can be in direct contact with the first barrier layer, the Cu layer can be in direct contact with the second Ti layer, the third Ti layer can be in direct contact with the Cu layer, and the second barrier layer can be in direct contact with the third Ti layer. In some embodiments, thicknesses of the first barrier layer and the second Ti layer can be selected to provide sufficient barrier functionality between the Cu layer and an ohmic metal layer disposed between the first Ti layer and the substrate. The first Ti layer can have a thickness sufficient to function as an adhesion layer. As examples, the first Ti layer can have a thickness of approximately 1,000 angstroms, the first Pt layer can have a thickness of approximately 500 angstroms, and the second Ti layer can have a thickness of approximately 1,000 angstroms.

In some embodiments, the Cu layer can have a thickness selected to yield a resistivity value similar to that of a gold layer being replaced by the Cu layer. As an example, the Cu layer can have a thickness of approximately 25,000 angstroms.

In some embodiments, the structure can further include a gold (Au) layer disposed over the second barrier layer. Thicknesses of the third Ti layer and the second barrier layer can be selected to provide sufficient passivation functionality between the Cu layer and the Au layer. As examples, the third Ti layer can have a thickness of approximately 500 angstroms, and the second barrier layer can include a platinum (Pt) layer having a thickness of approximately 500 angstroms.

In some embodiments, the structure can further include a fourth Ti layer disposed over the Au layer. As examples, the Au layer can have a thickness of approximately 1,200 angstroms, and the fourth Ti layer can have a thickness of approximately 90 angstroms. In some embodiments, each of the first Ti layer, the first barrier layer, the second Ti layer, the Cu layer, the third Ti layer, the second barrier layer, the Au layer, and the fourth Ti layer can be formed by evaporation.

In accordance with a number of implementations, the present disclosure relates to a method for forming a metalized structure for a compound semiconductor device. The method includes forming a first titanium (Ti) layer over a substrate associated with the compound semiconductor device, The method further includes forming a first barrier layer over the first Ti layer. The method further includes forming a second Ti layer over the first barrier layer. The method further includes forming a copper (Cu) layer over the second Ti layer.

In some embodiments, the method can further include forming a third Ti layer over the Cu layer, and forming a second barrier layer over the third Ti layer. In some embodiments, the method can further include forming a gold (Au) layer over the second Pt layer. In some embodiments, the method can further include forming a fourth Ti layer over the Au layer.

In some embodiments, each of the first Ti layer, the first barrier layer, the second Ti layer, the Cu layer, the third Ti layer, the second barrier layer, the Au layer, and the fourth Ti layer can be formed by evaporation. In some embodiments, each of the first barrier layer and the second barrier layer can include platinum (Pt), palladium (Pd), or nickel (Ni).

According to a number of implementations, the present disclosure relates to a compound semiconductor die that includes a semiconductor device formed on a compound semiconductor substrate. The die further includes an interconnect metalized stack for the semiconductor device. The metalized stack includes a first titanium (Ti) layer disposed over a substrate associated with the semiconductor device, a first barrier layer disposed over the first Ti layer, a second Ti layer disposed over the first barrier layer, and a copper (Cu) layer disposed over the second Ti layer.

In some embodiments, the interconnect metalized stack can further include a third Ti layer disposed over the Cu layer, and a second barrier layer disposed over the third Ti layer. In some embodiments, the interconnect metalized stack can further include a gold (Au) layer disposed over the second barrier layer, and a fourth Ti layer disposed over the Au layer. In some embodiments, each of the first barrier layer and the second barrier layer can include platinum (Pt), palladium (Pd), or nickel (Ni).

In some embodiments, the compound semiconductor die can be a gallium arsenide GaAs die. In some embodiments, the semiconductor device can include a pseudomorphic high electron mobility transistor (pHEMT), a metal semiconductor field effect transistor (MESFET), a heterojunction bipolar transistor (HBT), a Mach-Zehnder (MZ) modulator, a photovoltaic device, a light-emitting diode (LED), a bipolar FET (BiFET), a bipolar HEMT (BiHEMT), a laser diode such as a vertical cavity laser (VCSEL) diode, or a surface acoustic wave (SAW) device such as a SAW filter or resonator.

In a number of implementations, the present disclosure relates to a radio-frequency (RF) module that includes a packaging substrate configured to receive a plurality of components. The module further includes a die mounted on the packaging substrate and having a semiconductor device formed on a compound semiconductor substrate. The die further includes an interconnect metalized stack for the semiconductor device. The metalized stack includes a first titanium (Ti) layer disposed over a substrate associated with the semiconductor device, a first barrier layer disposed over the first Ti layer, a second Ti layer disposed over the first barrier layer, and a copper (Cu) layer disposed over the second Ti layer.

According to some implementations, the present disclosure relates to a radio-frequency (RF) device that includes an antenna, and an RF circuit in communication with the antenna and configured to provide transmit and/or receive functionality. The RF device further includes a module configured to facilitate the operation of the antenna and the RF circuit. The module includes a semiconductor device formed on a compound semiconductor substrate. The module further includes an interconnect metalized stack for the semiconductor device. The metalized stack includes a first titanium (Ti) layer disposed over a substrate associated with the semiconductor device, a first barrier layer disposed over the first Ti layer, a second Ti layer disposed over the first barrier layer, and a copper (Cu) layer disposed over the second Ti layer.

In some implementations, the present disclosure relates to a metalized structure for a compound semiconductor device. The structure includes a first titanium (Ti) layer disposed over a substrate associated with the compound semiconductor device. The structure further includes a first titanium nitride (TiN) layer disposed over the first Ti layer. The structure further includes a copper (Cu) layer disposed over the first TiN layer.

In some embodiments, the first Ti layer and the first TiN layer can be configured to yield a barrier between the Cu layer and the substrate. In some embodiments, the structure can further include a second TiN layer disposed over the Cu layer and a first platinum (Pt) layer disposed over the second TiN layer. The first TiN layer can be in direct contact with the first Ti layer, the Cu layer can be in direct contact with the first TiN layer, the second TiN layer can be in direct contact with the Cu layer, and the first Pt layer can be in direct contact with the second TiN layer.

In some embodiments, a thickness of the first TiN layer can selected to provide sufficient barrier functionality between the Cu layer and an ohmic metal layer disposed between the first Ti layer and the substrate. The first Ti layer can have a thickness sufficient to function as an adhesion layer. As examples, the first Ti layer can have a thickness of approximately 1,000 angstroms, and the first TiN layer can have a thickness of approximately 500 angstroms.

In some embodiments, the Cu layer can have a thickness selected to yield a resistivity value similar to that of a gold layer being replaced by the Cu layer. As an example, the Cu layer can have a thickness of approximately 25,000 angstroms.

In some embodiments, the structure can further include a gold (Au) layer disposed over the first Pt layer. In some embodiments, the structure can further include a second Ti layer disposed over the Au layer. As examples, the Au layer can have a thickness of approximately 1,200 angstroms, and the second Ti layer can have a thickness of approximately 90 angstroms. In some embodiments, each of the first Ti layer, the first TiN layer, the Cu layer, the second TiN layer, the first Pt layer, the Au layer, and the second Ti layer can be formed by evaporation.

In accordance with some implementations, the present disclosure relates to a method for forming a metalized structure for a compound semiconductor device. The method includes forming a first titanium (Ti) layer over a substrate associated with the compound semiconductor device. The method further includes forming a first titanium nitride (TiN) layer over the first Ti layer. The method further includes forming a copper (Cu) layer over the first TiN layer.

In some embodiments, the method can further include forming a second TiN layer over the Cu layer, and forming a first Pt layer over the second TiN layer. In some embodiments, the method can further include forming a gold (Au) layer over the first Pt layer. In some embodiments, the method can further include forming a second Ti layer over the Au layer.

In some embodiments, each of the first Ti layer, the first TiN layer, the Cu layer, the second TiN layer, the first Pt layer, the Au layer, and the second Ti layer can be formed by evaporation. The evaporation of each of the first and second TiN layers can include evaporating Ti with an assist from an ion source, and introducing nitrogen gas during at least a portion of the Ti evaporation from the ion source to form the TiN layer.

In accordance with a number of implementations, the present disclosure relates to a compound semiconductor die that includes a semiconductor device formed on a compound semiconductor substrate. The die further includes an interconnect metalized stack for the semiconductor device. The metalized stack includes a first titanium (Ti) layer disposed over a substrate associated with the semiconductor device, a first titanium nitride (TiN) layer disposed over the first Ti layer, and a copper (Cu) layer disposed over the first TiN layer.

In some embodiments, the interconnect metalized stack can further include a second TiN layer disposed over the Cu layer, and a platinum (Pt) layer disposed over the second TiN layer. In some embodiments, the interconnect metalized stack can further include a gold (Au) layer disposed over the Pt layer, and a second Ti layer disposed over the Au layer.

In some embodiments, the compound semiconductor die can be a gallium arsenide GaAs die. In some embodiments, the semiconductor device can include a pseudomorphic high electron mobility transistor (pHEMT), a metal semiconductor field effect transistor (MESFET), a heterojunction bipolar transistor (HBT), a Mach-Zehnder (MZ) modulator, a photovoltaic device, a light-emitting diode (LED), a bipolar FET (BiFET), a bipolar HEMT (BiHEMT), a laser diode such as a vertical cavity laser (VCSEL) diode, or a surface acoustic wave (SAW) device such as a SAW filter or resonator.

In a number of implementations, the present disclosure relates to a radio-frequency (RF) module that includes a packaging substrate configured to receive a plurality of components. The module further includes a die mounted on the packaging substrate and including a semiconductor device formed on a compound semiconductor substrate. The die further includes an interconnect metalized stack for the semiconductor device. The metalized stack includes a first titanium (Ti) layer disposed over a substrate associated with the semiconductor device, a first titanium nitride (TiN) layer disposed over the first Ti layer, and a copper (Cu) layer disposed over the first TiN layer.

In some implementations, the present disclosure relates to a radio-frequency (RF) device that includes an antenna, and an RF circuit in communication with the antenna and configured to provide transmit and/or receive functionality. The RF device further includes a module configured to facilitate the operation of the antenna and the RF circuit. The module includes a semiconductor device formed on a compound semiconductor substrate. The module further includes an interconnect metalized stack for the semiconductor device. The metalized stack includes a first titanium (Ti) layer disposed over a substrate associated with the semiconductor device, a first titanium nitride (TiN) layer disposed over the first Ti layer, and a copper (Cu) layer disposed over the first TiN layer.

In a number of implementations, the present disclosure relates to a metalized structure for a compound semiconductor device. The structure includes a stack disposed over a substrate associated with the compound semiconductor device. The stack includes a barrier and a copper (Cu) layer disposed over the barrier. The structure further includes a sputtered titanium tungsten (TiW) layer disposed over the stack.

In some embodiments, the barrier can include a titanium nitride (TiN) layer disposed over a Ti layer. In some embodiments, the barrier can include a first titanium layer, a barrier layer disposed over the first Ti layer, and a second Ti layer disposed over the barrier layer. The barrier layer can include platinum (Pt), palladium (Pd), or nickel (Ni).

In some embodiments, the stack can further include a titanium (Ti) layer disposed between the Cu layer and the sputtered TiW layer. In some embodiments, the stack can further include a gold (Au) layer disposed over the sputtered TiW layer. The sputtered TiW layer can have a thickness sufficient to inhibit interaction between the Cu layer and the Au layer. In some embodiments, the stack can further include a Ti layer disposed over the Au layer. In some embodiments, each layer of the stack can be formed by evaporation. In some embodiments, each of the Au layer and the Ti layer above the Au layer can be formed by evaporation. In some embodiments, the sputtered TiW can be substantially free of wing or stringer features.

In accordance with a number of implementations, the present disclosure relates to a method for forming a metalized structure for a compound semiconductor device. The method includes forming a resist mask that defines an opening over a substrate associated with the compound semiconductor device. The method further includes forming a stack within the opening and over the substrate. The stack includes a barrier and a copper (Cu) layer formed over the barrier. The method further includes sputtering a titanium tungsten (TiW) layer over the stack in a manner that allows the resist mask to be removed by a liftoff process.

In some embodiments, the resist mask can have a re-entrant profile at the opening. In some embodiments, forming of the stack can further include forming a titanium (Ti) layer between the Cu layer and the TiW layer. In some embodiments, the method can further include forming a gold (Au) layer over the TiW layer. In some embodiments, the method can further include forming a Ti layer over the Au layer. In some embodiments, the method can further include lifting off the resist mask to thereby yield a trapezoid shaped stack.

According to some implementations, the present disclosure relates to a compound semiconductor die that includes a semiconductor device formed on a compound semiconductor substrate. The die further includes an interconnect metalized stack for the semiconductor device. The metalized stack includes a copper (Cu) layer disposed over a barrier. The metalized stack further includes a sputtered titanium tungsten (TiW) layer disposed over the Cu layer.

In some embodiments, the metalized stack can further include a titanium (Ti) layer disposed between the Cu layer and the TiW layer.

In a number of implementations, the present disclosure relates to a radio-frequency (RF) module that includes a packaging substrate configured to receive a plurality of components. The module further includes a die mounted on the packaging substrate and including a semiconductor device formed on a compound semiconductor substrate. The die further includes an interconnect metalized stack for the semiconductor device. The metalized stack includes a copper (Cu) layer disposed over a barrier. The metalized stack further includes a sputtered titanium tungsten (TiW) layer disposed over the Cu layer.

In some implementations, the present disclosure relates to a radio-frequency (RF) device that includes an antenna and an RF circuit in communication with the antenna and configured to provide transmit and/or receive functionality. The RF device further includes a module configured to facilitate the operation of the antenna and the RF circuit. The module includes a semiconductor device formed on a compound semiconductor substrate. The module further includes an interconnect metalized stack for the semiconductor device. The metalized stack includes a copper (Cu) layer disposed over a barrier. The metalized stack further includes a sputtered titanium tungsten (TiW) layer disposed over the Cu layer.

In accordance with a number of implementations, the present disclosure relates to a metalized structure for a compound semiconductor. The structure includes an adhesion layer disposed over a surface of the compound semiconductor. The structure further includes a barrier layer disposed over the adhesion layer. The structure further includes a copper (Cu) layer disposed over the barrier layer. The barrier layer is configured to substantially survive a high temperature operating life (HTOL) stress at approximately 200° C. for at least 100 hours.

In some embodiments, the structure can further include a passivation layer disposed over the Cu layer. In some embodiments, the adhesion layer can include a first titanium (Ti) layer.

In some embodiments, the barrier layer can include a second Ti layer and a first platinum (Pt) layer, with the second Ti layer being disposed over the first Pt layer. The passivation layer can include a second Pt layer and a third Ti layer, with the second Pt layer being disposed over the third Ti layer. In some embodiments, the structure can further include a gold layer disposed over the second Pt layer.

In some embodiments, the barrier layer can include a first titanium nitride (TiN) layer. The passivation layer can include a second Pt layer and a second TiN layer, with the second Pt layer being disposed over the second TiN layer. In some embodiments, the structure can further include a gold layer disposed over the second Pt layer.

In some embodiments, each of the adhesion, barrier, Cu, and passivation layers can be formed by evaporation deposition. In some embodiments, at least some of the passivation layer can include a sputtered layer. In some embodiments, the passivation layer can includes a sputtered titanium tungsten (TiW) layer and an evaporated titanium (Ti) layer, with the TiW layer being disposed over the Ti layer.

In some embodiments, the adhesion, barrier, Cu, and Ti layers can have a side profile corresponding to a re-entrant resist profile. The Cu layer can have a sufficient thickness such that copper deposited on the re-entrant resist profile yields a modified resist profile dimensioned to allow formation of the sputtered TiW layer substantially without wing or stringer features to thereby facilitate a liftoff process.

In some embodiments, the structure can further include a gold layer disposed over the second TiW layer. In some embodiments, the compound semiconductor can include gallium arsenide (GaAs).

According to some implementations, the present disclosure relates to a semiconductor die that includes an integrated circuit (IC) having at least one transistor formed on a compound semiconductor substrate. The die further includes a metalized structure configured to facilitate an electrical connection for the transistor. The metalized structure includes an adhesion layer disposed over a surface of the compound semiconductor, a barrier layer disposed over the adhesion layer, and a copper (Cu) layer disposed over the barrier layer, with the barrier layer being configured to substantially survive a high temperature operating life (HTOL) test at a temperature between 270° C. and 273° C. for at least 100 hours or 500 hours.

In some embodiments, the compound semiconductor substrate can include gallium arsenide (GaAs). In some embodiments, the at least one transistor can include a heterojunction bipolar transistor (HBT) or a pseudomorphic high electron mobility transistor (pHEMT).

In a number of implementations, the present disclosure relates to a packaged electronic module that includes a packaging substrate configured to receive a plurality of components. The module further includes a semiconductor die mounted on the packaging substrate. The die includes an integrated circuit having at least one transistor formed on a compound semiconductor substrate. The die further includes a metalized structure configured to facilitate an electrical connection for the transistor. The metalized structure includes an adhesion layer disposed over a surface of the compound semiconductor, a barrier layer disposed over the adhesion layer, and a copper (Cu) layer disposed over the barrier layer. The barrier layer is configured to substantially survive a high temperature operating life (HTOL) test at a temperature between 270° C. and 273° C. for at least 100 hours or 500 hours. The module further includes a contact pad disposed on the packaging substrate and electrically connected to the metalized structure.

In some implementations, the present disclosure relates to a radio-frequency (RF) device that includes an RF circuit configured to generate a transmit signal and/or process a received signal. The RF device further includes a module configured to facilitate transmission of the transmit signal and/or processing of the received signal. The module includes a semiconductor die having at least one transistor formed on a compound semiconductor substrate. The die further includes a metalized structure configured to facilitate an electrical connection for the transistor. The metalized structure includes an adhesion layer disposed over a surface of the compound semiconductor, a barrier layer disposed over the adhesion layer, and a copper (Cu) layer disposed over the barrier layer. The barrier layer is configured to substantially survive a high temperature operating life (HTOL) test at a temperature between 270° C. and 273° C. for at least 100 hours or 500 hours.

In some embodiments, the RF device can include a wireless device. In some embodiments, the wireless device can include a cellular phone.

In some implementations, the present disclosure relates to a method for forming a metalized structure. The method includes providing a compound semiconductor substrate. The method further includes forming a photoresist layer over the substrate. The method further includes patterning the photoresist layer to define an opening. The method further includes evaporating copper stack over the patterned photoresist layer. The copper stack includes an adhesion layer, a barrier layer, and a copper layer. The method further includes forming a passivation layer over the copper stack. The method further includes performing a liftoff process to remove a portion of the copper stack that is over the photoresist layer to yield the metalized structure at a location of the opening.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

The present disclosure relates to U.S. patent application Ser. No. 13/774,228, titled "COPPER INTERCONNECTS HAVING A TITANIUM-BARRIER-TITANIUM ASSEMBLY BETWEEN COPPER AND COMPOUND SEMICONDUCTOR," and U.S. Pat. No. 8,878,362, titled "COPPER INTERCONNECTS HAVING A TITANIUM-TITANIUM NITRIDE ASSEMBLY BETWEEN COPPER AND COMPOUND SEMICONDUCTOR," each filed on even date herewith and each hereby incorporated by reference herein in its entirety.

BRIEF DESCRIPTION OF THE DRAWINGS

FIGS. 17A and 17B show a process that can be implemented to fabricate the first example metal stack of FIGS. 10 and 11.

FIGS. 18A and 18B show various stages of the example fabrication process of FIGS. 17A and 17B.

FIG. 23 shows a process that can be implemented to fabricate a die having one or more metalized structures as described herein.

FIG. 24 schematically depicts a die that can result from the fabrication process of FIG. 23.

FIGS. 25A and 25B schematically depict a module having one or more dies of FIG. 24.

FIG. 26 schematically depicts a radio-frequency (RF) device that includes one or more dies and/or one or more modules having one or more features as described herein.

DETAILED DESCRIPTION OF SOME EMBODIMENTS

The headings provided herein, if any, are for convenience only and do not necessarily affect the scope or meaning of the claimed invention.

Metalized features formed on semiconductors such as compound semiconductors can be configured to provide, for example, interconnect functionalities. Such interconnects are commonly referred to as Metal 1, Metal 2 and Metal 3. Metal 1 or M1 commonly refers to a layer of metal interconnect that contacts ohmic metals and/or other active or passive components (e.g., resistors, capacitors, inductors) in circuits. Metal 2 or M2 commonly refers to a metal layer that connects to an M1 layer. Metal 3 or M3 commonly refers to a heat spreader (e.g., in a power amplifier).

In some implementations, gold can be chosen for use as M1 interconnects due to its properties such as low electrical resistivity, chemical inertness and desirable wire bonding properties. However, gold is relatively expensive, and its price has been rising steadily. Consequently, costs associated with wafers and resulting devices using gold as M1 interconnects can also increase.

Accordingly, a less expensive alternative having one or more desirable properties of gold is desirable. Copper can be such an alternative. By way of examples, copper has about 20% lower electrical resistivity than gold (approximately 1.7 $\mu\Omega$-cm for copper, and approximately 2.2 $\mu\Omega$-cm for gold). Copper also has higher thermally conductivity than gold (approximately 385 W m$^{-1}$ K$^{1}$ for copper, and approximately 314 W m$^{-1}$ K$^{1}$ for gold), making it a desirable replacement for gold for M3 heat spreader application.

Use of copper, however, can include challenges when implemented on semiconductor substrates. For example, copper is a relatively fast diffuser; so a barrier layer is typically needed to prevent the metal from diffusing into a semiconductor substrate. Copper is also chemically reactive and oxidizes readily in air; and therefore it typically needs to be passivated so as to be protected from process chemicals and/or fabrication environment between steps.

Described herein are structures, devices and methods related to metal structures (such as M1 interconnects) based on copper. Various examples of barriers and passivation configurations that provide desirable functionalities that facilitate use of copper as an interconnect conductor are described. Although described in the context of M1 interconnects, it will be understood that one or more features of the present disclosure can also be implemented in other types of copper-based metal structures.

Figure 1:
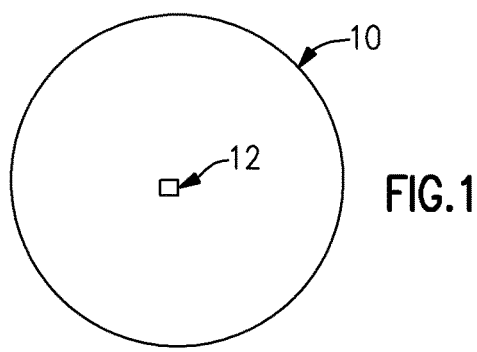
FIG. 1 schematically shows that in some implementations, a device having one or more features as described herein can be formed on a compound semiconductor substrate such as a wafer.

FIG. 1 shows that in some implementations, a device 12 formed on a compound semiconductor substrate (such as a wafer 10) can include one or more copper-based interconnect structures having one or more features as described herein. Various examples described herein are in the context of gallium arsenide (GaAs) compound semiconductor on which such copper-based interconnect structures can be implemented. However, it will be understood that such copper-based interconnect features can also be implemented on other compound semiconductors. For example, compound semiconductors such as InP, GaN, InGaP, and InGaAs can be utilized as a substrate on which copper-based interconnects having one or more features as described herein are formed.

It will also be understood that although various examples herein are described in the context of compound semiconductors, one or more features of the present disclosure can also be implemented on elemental semiconductors. For example, elemental semiconductors such as silicon and/or germanium can be utilized as a substrate on which copper-based interconnects having one or more features as described herein are formed.

Figure 2A:
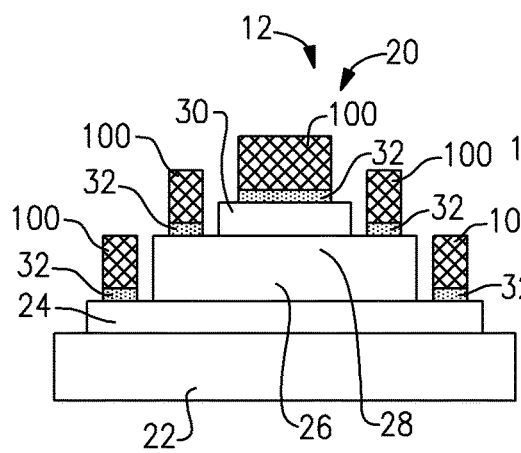
FIGS. 2A and 2B show examples of the device of FIG. 1, where the device can include a copper-based metalized structure.
Figure 2B:
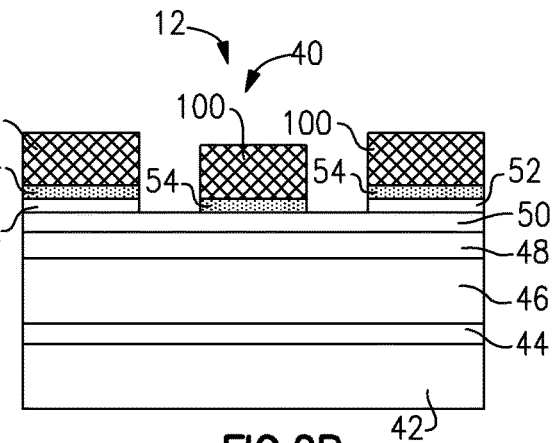

FIGS. 2A and 2B show examples of devices 12 for which copper-based interconnect structures can be implemented. In FIG. 2A, a heterojunction bipolar transistor (HBT) 20 is shown to include a number of copper-based structures 100 formed as various contacts. For example, copper-based contacts 100 are shown to be formed over a sub-collector layer 24 (which is formed over a semi-insulating compound semiconductor substrate 22 such as GaAs). In another example, copper-based contacts 100 are shown to be formed over a base layer 28 (which is formed over a collector layer 26). In yet another example, a copper-based contact 100 is shown to be formed over an emitter stack 30 (which is formed over the base layer 28). In the example configuration 20 of FIG. 2A, ohmic metal layers 32 are shown to be disposed between the copper-based contacts 100 and their respective semiconductor substrates.

In FIG. 2B, a high electron mobility transistor (HEMT) such as a pseudomorphic HEMT (pHEMT) 40 is shown to include a number of copper-based structures 100 formed as various contacts. The pHEMT 40 is shown to include a compound semiconductor substrate 42 (such as GaAs) over which is formed a buffer layer 44. A superlattice structure 46 is shown to be formed over the buffer layer 44, and a channel layer 48 is shown to be formed over the superlattice structure 46. A barrier layer 50 is shown to be formed over the channel layer 48, and capping layers 52 are shown to be formed over portions of the barrier layer 50. Copper-based contacts 100 are shown to be formed over the capping layers 52 so as to form source and drain contacts. A copper-based contact 100 is also shown to be formed over the barrier layer 50 so as to form a gate contact. In the example configuration 40 of FIG. 2B, ohmic metal layers 54 are shown to be disposed between the copper-based contacts 100 and their respective semiconductor substrates.

In some embodiments, copper-based structures 100 can also be implemented in other semiconductor devices. Examples of such semiconductor devices are described herein in greater detail.

Figure 3:
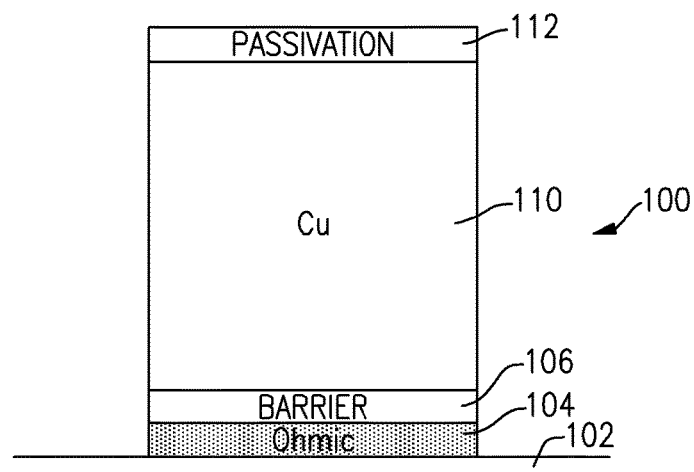
FIG. 3 shows an example of the copper-based metal stack structure.

FIG. 3 shows that a copper-based metalized structure 100 such as an M1 structure can include a copper (Cu) layer 110 disposed over a barrier 106. The barrier 106 is shown to be formed over an ohmic metal layer 104 which is formed over a compound semiconductor substrate 102. As further shown in FIG. 3, the metalized structure 100 can also include a passivation structure 112 formed over the copper layer 110. Various non-limiting examples of the barrier 106 and the passivation structure 112 and how they can be formed are described herein.

Example 1

Figure 4:
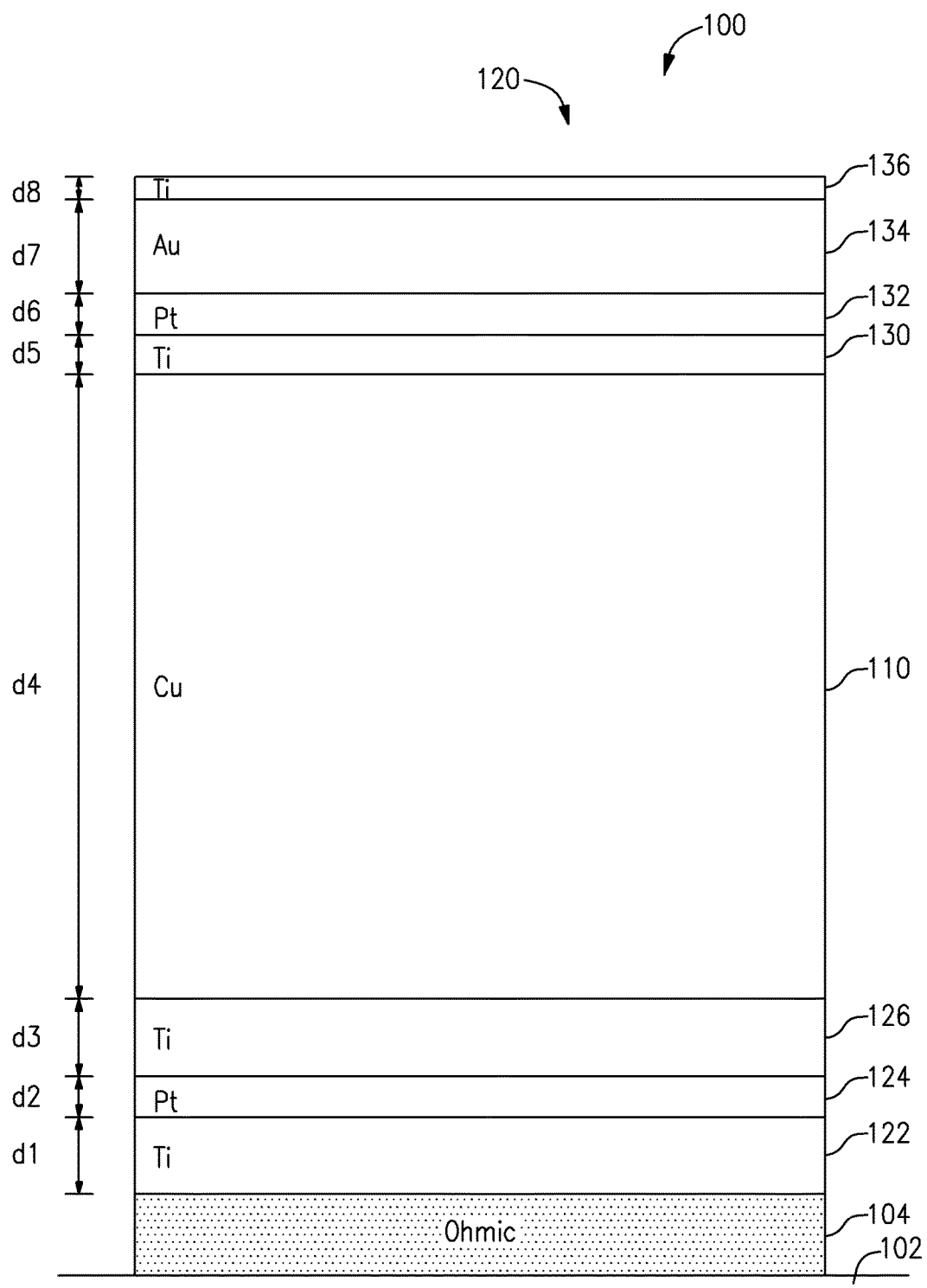
FIG. 4 schematically shows a first example configuration of the copper-based metal stack structure.

FIG. 4 schematically shows a first example configuration 120 of a copper-based metal stack structure 100. An ohmic metal layer 104 can be formed over a compound semiconductor substrate 102 such as GaAs. A first titanium (Ti) layer 122 (thickness d1) can be formed over the ohmic metal layer 104. A first platinum (Pt) layer 124 (thickness d2) can be formed over the first Ti layer 122. A second Ti layer 126 (thickness d3) can be formed over the first Pt layer 124. A copper (Cu) layer 110 (thickness d4) can be formed over the second Ti layer 126. Examples of desirable functionalities that can be provided by some or all of the foregoing Ti—Pt—Ti combination, as well as some possible alternate configurations, are described herein in greater detail.

In some embodiments, a third Ti layer 130 (thickness d5) can be formed over the Cu layer 110 A second Pt layer 132 (thickness d6) can be formed over the third Ti layer 130 A gold (Au) layer 134 (thickness d7) can be formed over the second Pt layer 132 A fourth Ti layer 136 (thickness d8) can be formed over the Au layer 134. Examples of desirable functionalities that can be provided by some or all of the foregoing combination, as well as some possible alternate configurations, are described herein in greater detail.

Table 1 lists example thicknesses of the various layers shown in FIG. 4.

TABLE 1

| Layer | Dimension | Approximate value (Angstrom) |
|---|---|---|
| First Ti | d1 | 1,000 |
| First Pt | d2 | 500 |
| Second Ti | d3 | 1,000 |
| Cu | d4 | 25,000 |
| Third Ti | d5 | 500 |
| Second Pt | d6 | 500 |
| Au | d7 | 1,200 |
| Fourth Ti | d8 | 90 |

Figure 5A:
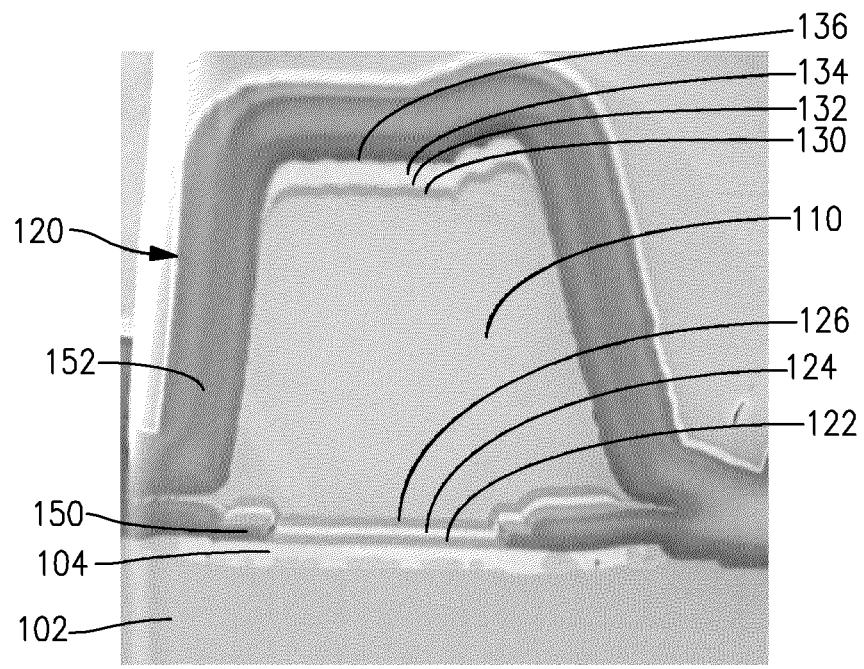
FIG. 5A shows a photograph of a sectional view of the example metalized stack of FIG. 4.
Figure 5B:
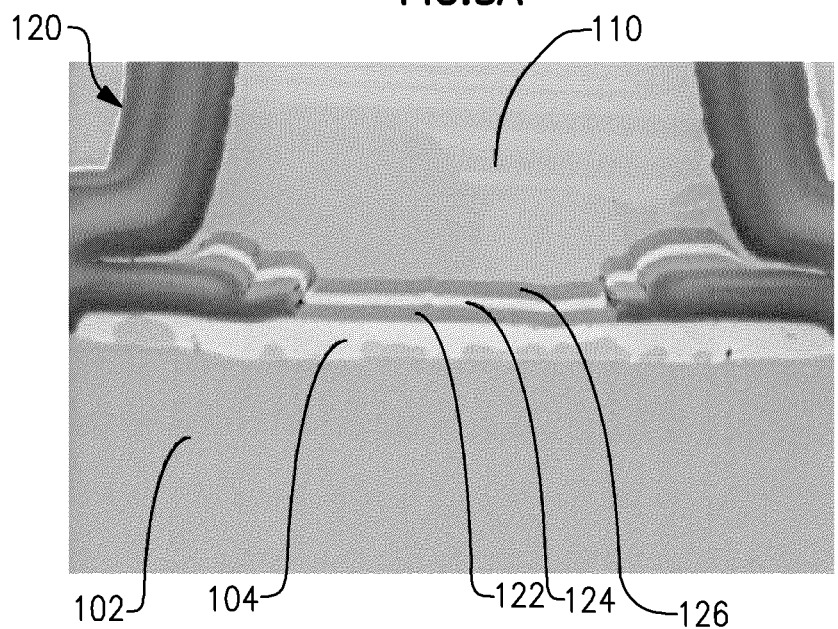
FIG. 5B shows a closer view of the example metalized stack of FIG. 5A.

FIG. 5A shows a sectional view of a photograph of a metalized stack 120 having the example configuration described in reference to FIG. 4. FIG. 5B shows a closer view of the metalized stack 120 of FIG. 5A. In both photographs, one can see that the example assembly of layers Ti—Pt—Ti (122, 124, 126) can be formed in an opening formed in a passivation layer 150 that has been formed over the ohmic metal layer 104 and the GaAs substrate 102. Further, FIGS. 5A and 5B show that a passivation layer 152 can be formed so as to cover some or all of the side and upper surfaces that would otherwise be exposed.

Figure 6A:
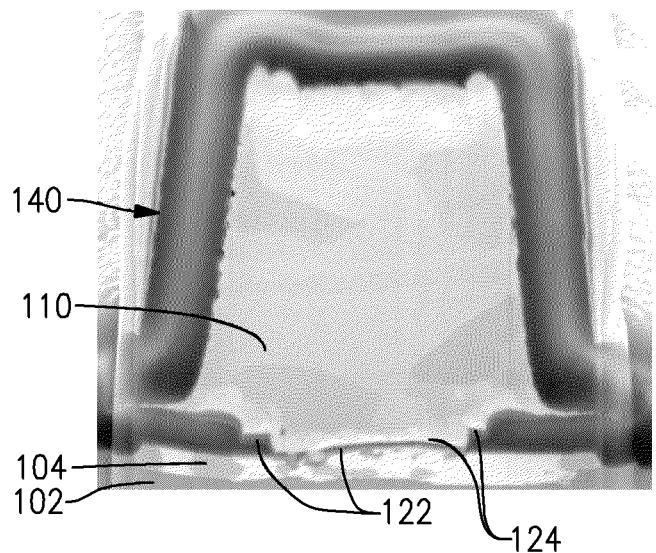
FIG. 6A shows an example of how a barrier can fail without one or more features of the example metalized stack of FIGS. 4 and 5.

In some implementations, at least some of the layers of the example metalized stack 120 described in reference to FIGS. 4 and 5 can be formed by electron-beam evaporation deposition. Applicant has found that Ti can be an adequate barrier for Cu, and Pt can be a good barrier for Cu for preventing or reducing diffusion. In the metalized stack 120, the Cu layer is shown to be clad between two Ti layers. Applicant's reliability tests have shown that without the Ti layers, Pt would alloy with the Cu causing the barrier to fail (FIG. 6A). When this happens, the resistivity of the M1 stack can increase drastically, thereby resulting in failure of the device associated with the M1 stack. The Cu would also reach the top 1200A of Au causing the M1 to discolor and also resulting in wire bonding issues (FIG. 6B).

FIG. 6A shows an example configuration 140 where Ti layers are absent on both sides of the Cu layer 110. Thus, the example stack 140 includes layers Ti (122), Pt (124), Cu (110), Pt (132 in FIG. 4), Au (134 in FIG. 4) and Ti (136 in FIG. 4) formed over an ohmic metal layer 104. FIG. 6A shows that without a Ti layer (126 in FIG. 4) between the Cu layer 110 and the Pt layer 124, the Pt layer 124 becomes degraded, and thus is not a reliable barrier for Cu 110. It is believed that such a degradation is due to copper and platinum forming an alloy at relatively low temperatures.

Figure 6B:
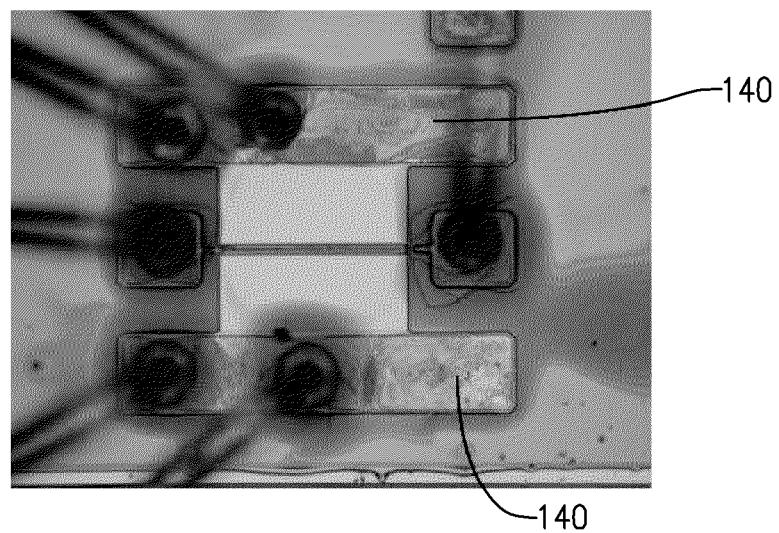
FIG. 6B shows an example of how M1 can become discolored and have reduced wire bonding performance in a configuration without one or more features of the example metalized stack of FIGS. 4 and 5.

Referring to FIG. 6B, with the absence of a Ti layer (130 in FIG. 4) between the Cu layer 110 and the upper Pt layer (132 in FIG. 4), copper is also able to reach the gold layer (134 in FIG. 4), thereby resulting in discoloration (e.g., non-uniform patterns on the surfaces) of the M1 structure 140 and undesirable features such as wire bonding issues. Again, it is believed that such a degradation of the upper Pt layer is due to copper and platinum forming an alloy at relatively low temperatures.

For the example metalized stack 120 of FIGS. 4 and 5, the first Ti layer 122 can be configured to provide functionalities such as adhesion and covering of surface irregularities due to, for example, roughness of the ohmic metal film 104. An example of how the first Ti layer 122 can be formed is described herein in greater detail. It will be understood that the thickness of the first Ti layer 122 can be less than or greater than the example thickness of approximately 1,000 angstroms. In some implementations, the thickness of the first Ti layer 122 can be selected to be sufficient to provide one or more of the foregoing functionalities.

For the example metalized stack 120 of FIGS. 4 and 5, the first Pt layer 124 can be configured to act as, for example, a barrier that reduces or inhibits migration of gold, copper and/or other atoms between the ohmic metal layer 104 (through the first Ti layer 122) and the Cu layer 110. An example of how the first Pt layer 124 can be formed is described herein in greater detail. It will be understood that the thickness of the first Pt layer 124 can be less than or greater than the example thickness of approximately 500 angstroms. In some implementations, the first Pt layer 124 can be formed so as to have a thickness d2 that is at least approximately 250 angstroms. In some embodiments, the thickness d2 can be significantly larger than the example thickness of 250 angstroms. In some implementations, the thickness of the first Pt layer 124 can be selected to be sufficient to provide one or more of the features as described herein.

For the example metalized stack 120 of FIGS. 4 and 5, the second Ti layer 126 can be configured to, for example, reduce or inhibit the Cu layer 110 from alloying with the first Pt layer 124. An example of how the second Ti layer 126 can be formed is described herein in greater detail. It will be understood that the thickness of the second Ti layer 126 can be less than or greater than the example thickness of approximately 1,000 angstroms. In some implementations, the thickness of the second Ti layer 126 can be selected to be sufficient to provide one or more of the features as described herein.

For the example metalized stack 120 of FIGS. 4 and 5, the Cu layer 110 can be configured to, for example, yield a desired resistivity. Because the Cu layer 110 can be configured as a main conductive layer of the stack 120, the Cu layer's sectional dimensions (e.g., thickness and/or width) can be selected to provide a desired conductive property of the stack 120. In the example stack 120 of FIGS. 4 and 5, the approximately 25,000 angstrom Cu layer 110 was selected to provide a roughly same sheet resistance associated with an approximately 30,000 angstrom gold layer which the Cu layer 110 is replacing. An example of how the Cu layer 110 can be formed is described herein in greater detail. It will be understood that the thickness of the Cu layer 110 can be less than or greater than the example thickness of approximately 25,000 angstroms. In some implementations, the thickness of the Cu layer 110 can be selected to be sufficient to provide one or more of the features as described herein.

For the example metalized stack 120 of FIGS. 4 and 5, the third Ti layer 130 can be configured to, for example, reduce or inhibit the Cu layer 110 from alloying with the second Pt layer 132. As described in reference to FIGS. 6A and 6B, such an alloying of the copper layer and the platinum layer can result in some of the copper reaching the gold layer and yielding discoloration and wire bonding issues associated with the metalized structure. An example of how the third Ti layer 130 can be formed is described herein in greater detail. It will be understood that the thickness of the third Ti layer 130 can be less than or greater than the example thickness of approximately 500 angstroms. In some implementations, the thickness of the third Ti layer 130 can be selected to be sufficient to provide one or more of the features as described herein.

For the example metalized stack 120 of FIGS. 4 and 5, the second Pt layer 132 can be configured to act as, for example, a barrier that reduces or inhibits migration of gold, copper and/or other atoms between the Au layer 134 (through the third Ti layer 130) and the Cu layer 110. An example of how the second Pt layer 132 can be formed is described herein in greater detail. It will be understood that the thickness of the second Pt layer 132 can be less than or greater than the example thickness of approximately 500 angstroms. In some implementations, the second Pt layer 132 can be formed so as to have a thickness d6 that is at least approximately 250 angstroms. In some embodiments, the thickness d6 can be significantly larger than the example thickness of 250 angstroms. In some implementations, the thickness of the second Pt layer 132 can be selected to be sufficient to provide one or more of the features as described herein.

For the example metalized stack 120 of FIGS. 4 and 5, the Au layer 134 can be configured to, for example, allow wire bonding of the metalized stack 120 and/or to protect the Cu layer 110 from oxidation. An example of how the Au layer 134 can be formed is described herein in greater detail. It will be understood that the thickness of the Au layer 134 can be less than or greater than the example thickness of approximately 1,200 angstroms. In some implementations, the thickness of the Au layer 134 can be selected to be sufficient to provide one or more of the features as described herein.

For the example metalized stack 120 of FIGS. 4 and 5, the fourth Ti layer 136 can be configured to, for example, provide a passivation layer for the Au layer 134, and/or to act as an adhesion layer for an additional passivation layer (e.g., a nitride layer) (e.g., 152 in FIG. 5A). An example of how the fourth Ti layer 136 can be formed is described herein in greater detail. It will be understood that the thickness of the fourth Ti layer 136 can be less than or greater than the example thickness of approximately 90 angstroms. In some implementations, the thickness of the fourth Ti layer 136 can be selected to be sufficient to provide one or more of the features as described herein.

In some implementations, a combination of layers that includes the first Ti layer 122, the first Pt layer 124, and the second Ti layer 126 can be configured to sufficiently reduce or prevent gold in the ohmic metal (104) from migrating to the Cu layer 110, and copper in the Cu layer 110 from diffusing into the ohmic metal (104). While it is not desired or intended to be bound by any particular theory, the Ti/Pt/Ti structure can be modeled or approximated electrically as two diodes back to back, to thereby inhibit or reduce Au in the ohmic layer (104) from moving towards the Cu layer 110, and to inhibit or reduce Cu (of the Cu layer 110) from moving into the Pt layer 124.

For a combination of layers that includes the third Ti layer 130, the second Pt layer 132, and the Au layer 134, such a combination can be configured to sufficiently reduce or prevent migration and/or diffusion between the Cu layer 110 and the Au layer 134. Such a combination can also be configured to be sufficiently robust mechanically to be able to withstand stress of wire bonding and/or probing.

In the example configuration 120 of FIGS. 4 and 5, dimensions (e.g., thickness) of the various layers can be different than their respective example values listed in Table 1. For example, the first Ti layer (122) can have a thickness that is in a range of 50 to 5,000 angstroms, in a range of 100 to 4,000 angstroms, 200 to 3,000 angstroms, 500 to 2,000 angstroms, or 750 to 1,250 angstroms. In another example, the first Pt layer (124) can have a thickness that is in a range of 50 to 5,000 angstroms, in a range of 100 to 2,500 angstroms, 200 to 1,000 angstroms, 300 to 700 angstroms, or 400 to 600 angstroms. In yet another example, the second Ti layer (126) can have a thickness that is in a range of 50 to 5,000 angstroms, in a range of 100 to 4,000 angstroms, 200 to 3,000 angstroms, 500 to 2,000 angstroms, or 750 to 1,250 angstroms. In yet another example, the Cu layer (110) can have a thickness that is in a range of 500 to 50,000 angstroms, in a range of 5,000 to 40,000 angstroms, 10,000 to 35,000 angstroms, or 20,000 to 30,000 angstroms. In yet another example, the third Ti layer (130) can have a thickness that is in a range of 50 to 5,000 angstroms, in a range of 100 to 2,500 angstroms, 200 to 1,000 angstroms, 300 to 700 angstroms, or 400 to 600 angstroms. In yet another example, the second Pt layer (132) can have a thickness that is in a range of 50 to 5,000 angstroms, in a range of 100 to 2,500 angstroms, 200 to 1,000 angstroms, 300 to 700 angstroms, or 400 to 600 angstroms. In yet another example, the Au layer (134) can have a thickness that is in a range of 100 to 5,000 angstroms, in a range of 200 to 4,000 angstroms, 300 to 3,000 angstroms, 500 to 2,000 angstroms, or 900 to 1,500 angstroms. In yet another example, the fourth Ti layer (136) can have a thickness that is in a range of 20 to 500 angstroms, in a range of 40 to 300 angstroms, 60 to 200 angstroms, or 70 to 110 angstroms.

In some embodiments, some or all of the layers in the example configuration 120 of FIGS. 4 and 5 can be formed from different materials to provide similar functionalities. For example, the first Ti layer (122) can be substituted with materials such as chromium (Cr). In another example, the first Pt layer (124) can be substituted with materials such as palladium (Pd) or nickel (Ni). In yet another example, the second Ti layer (126) can be substituted with materials such as chromium (Cr). In yet another example, the Cu layer (110) can be substituted with materials such as aluminum (Al). In yet another example, the third Ti layer (130) can be substituted with materials such as chromium (Cr). In yet another example, the second Pt layer (132) can be substituted with materials such as palladium (Pd) or nickel (Ni). In yet another example, the fourth Ti layer (136) can be substituted with materials such as chromium (Cr).

In the example configuration 120 of FIGS. 4 and 5, the ohmic layer 104 is described as being formed from gold. It will be understood that other types of ohmic layer can also be implemented. For devices such as MESFET and pHEMT, the ohmic layer can be an N-ohmic layer. For N-type semiconductors, the ohmic layer can include nickel, germanium (or gold-germanium AuGe) and/or gold. Different variations of such materials can be utilized, including for example, Ni/Ge/Au, Ni/Au/Ge/Au, Ni/AuGe/Au, Ni/Au/Ge/Ni/Au, Ge/Ni/Au, and AuGe/Ni/Au. For devices such as HBT, BiFET, BiHEMT, the ohmic layer can be N-ohmic or P-ohmic. The P-ohmic type can have Au in the layer with other metals such as Pt and Pd. Other configurations are also possible.

Example 2

Figure 7:
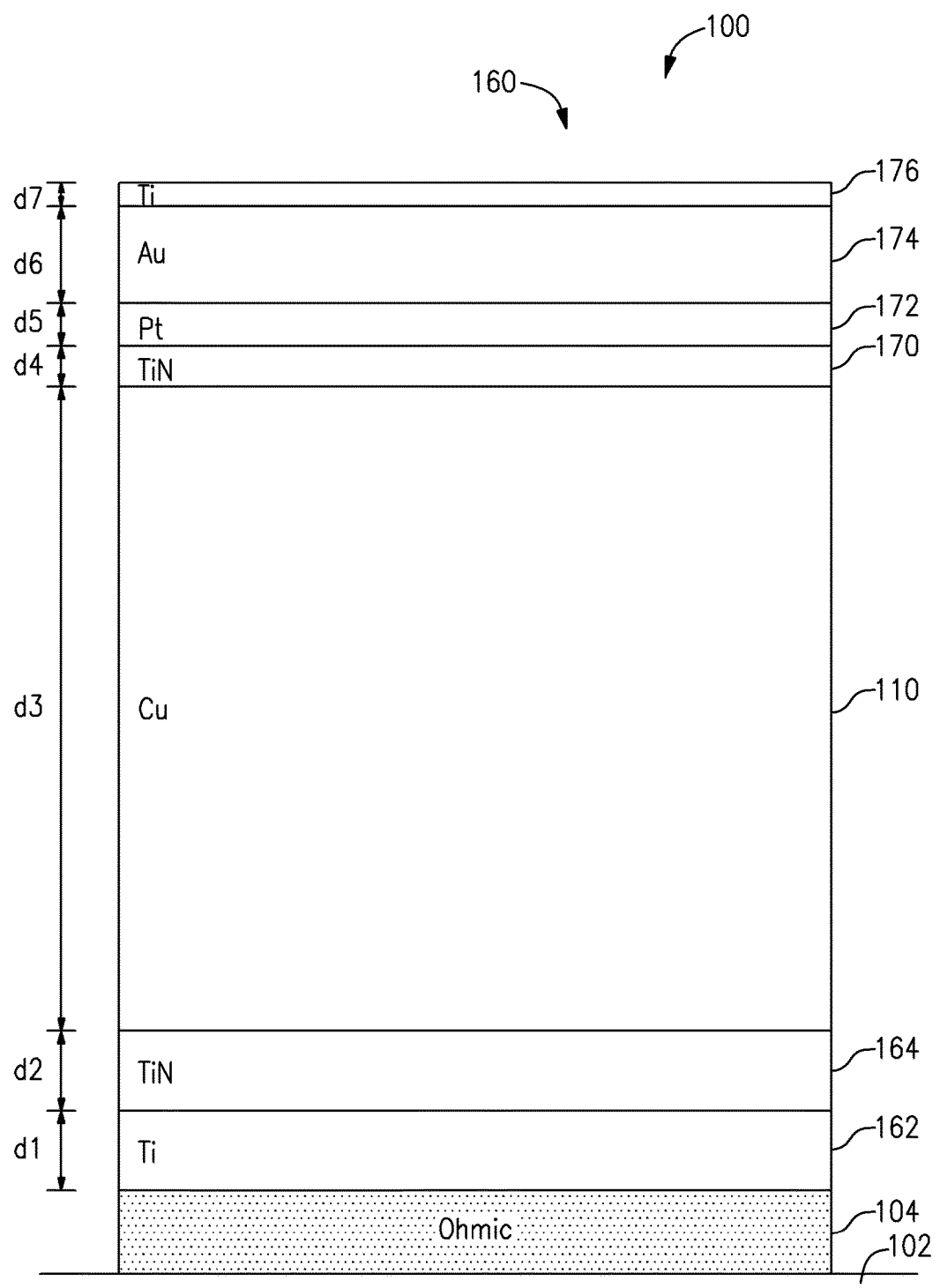
FIG. 7 schematically shows a second example configuration of the copper-based metal stack structure.

FIG. 7 schematically shows a second example configuration 160 of a copper-based metal stack structure 100. An ohmic metal layer 104 can be formed over a compound semiconductor substrate 102 such as GaAs. A first titanium (Ti) layer 162 (thickness d1) can be formed over the ohmic metal layer 104. A first titanium nitride (TiN) layer 164 (thickness d2) can be formed over the first Ti layer 162. A copper (Cu) layer 110 (thickness d3) can be formed over the first TiN layer 164. A second TiN layer 170 (thickness d4) can be formed over the Cu layer 110. A Pt layer 172 (thickness d5) can be formed over the second TiN layer 170. A gold (Au) layer 174 (thickness d6) can be formed over the Pt layer 172. A second Ti layer 176 (thickness d7) can be formed over the Au layer 174. Examples of desirable functionalities that can be provided by some or all of the foregoing combination, as well as some possible alternate configurations, are described herein in greater detail.

Table 2 lists example thicknesses of the various layers shown in FIG. 7.

TABLE 2

| Layer | Dimension | Approximate value (Angstrom) |
|---|---|---|
| First Ti | d1 | 1,000 |
| First TiN | d2 | 500 |
| Cu | d3 | 25,000 |
| Second TiN | d4 | 500 |
| Pt | d5 | 500 |
| Au | d6 | 1,200 |
| Second Ti | d7 | 90 |

Figure 8A:
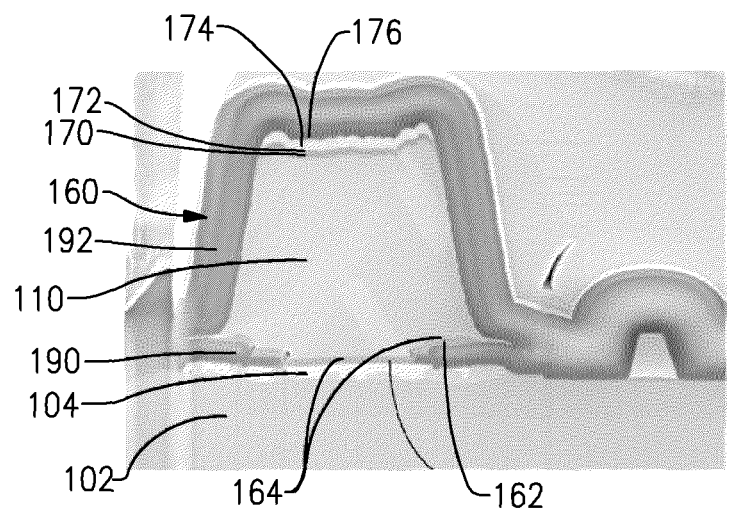
FIG. 8A shows a photograph of a sectional view of the example metalized stack of FIG. 7.
Figure 8B:
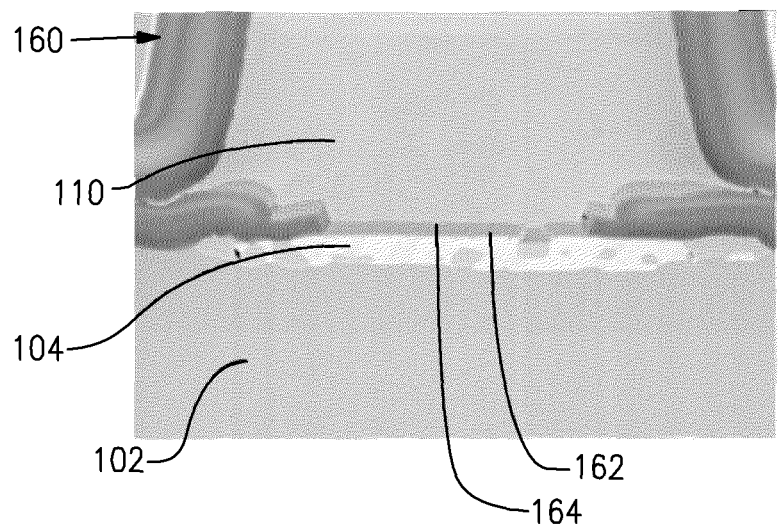
FIG. 8B shows a closer view of the example metalized stack of FIG. 8A.

FIG. 8A shows a sectional view of a photograph of a metalized stack 160 having the example configuration described in reference to FIG. 7. FIG. 8B shows a closer view of the metalized stack 160 of FIG. 8A. In both photographs, one can see that the example assembly of layers Ti—TiN (162, 164) can be formed in an opening formed in a passivation layer 190 that has been formed over the ohmic metal layer 104 and the GaAs substrate 102. Further, FIGS. 8A and 8B show that a passivation layer 192 can be formed so as to cover some or all of the side and upper surfaces that would otherwise be exposed.

In some implementations, at least some of the layers other than the TiN layers 164, 170 of the example metalized stack 160 described in reference to FIGS. 7 and 8 can be formed by electron-beam evaporation deposition. The TiN layers 164, 170 can be formed by use of an evaporator with such an ion source, in conjunction with introduction of N2 gas during such an evaporation process. In the metalized stack 160, the Cu layer is shown to be clad between two TiN layers 164, 170; and such TiN layers can reduce or inhibit interactions between the Cu layer 110 and the ohmic metal layer 104 (via the first TiN layer 164) and the Au layer 174 (via the second TiN layer 170).

Applicant's reliability tests have shown that without the TiN layers (e.g., a stack 180 having Ti/Cu/Ti/Au/Ti layers in FIG. 9A), Ti alone is not sufficient to act as a barrier. A failure of such a metalized structure typically begins at, for example, a step where the film is porous due to the nature of a liftoff evaporation process. It has been observed that a wafer with relatively greater amount of topography tends to fail more quickly. Focused ion beam/scanning electron microscopic analysis shows that significant voids 184 can form in the Cu layer 110 (FIG. 9A) thereby contributing to the failure. As with the first example, the Cu can also reach the top 1200 A of Au causing the M1 180 to discolor and also resulting in wire bonding issues (FIG. 9B).

Figure 9A:
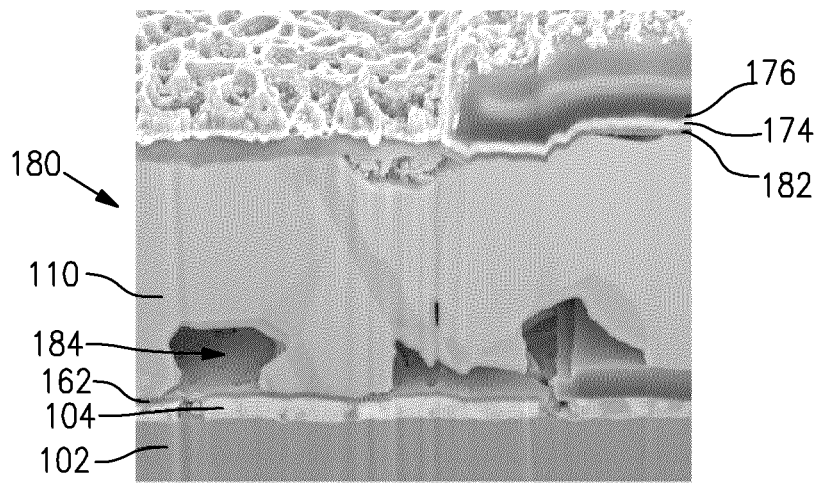
FIG. 9A shows an example of how significant voids can form in a copper layer in a configuration without one or more features of the example metalized stack of FIGS. 7 and 8.

FIG. 9A shows an example configuration 180 where TiN layers are absent on both sides of the Cu layer 110. Thus, the example stack 180 includes layers Ti (162), Cu (110), Ti (182), Au (174) and Ti (176) formed over an ohmic metal layer 104. FIG. 9A shows that without a TiN layer between the Cu layer 110 and the Ti layer 162, the Cu layer can form significant voids 184 that contribute to the degradation of the stack 180.

Figure 9B:
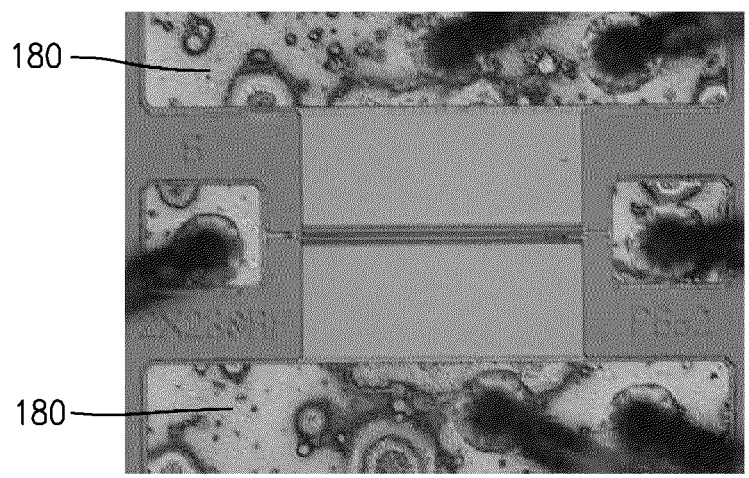
FIG. 9B shows an example of how M1 can become discolored and have reduced wire bonding performance in a configuration without one or more features of the example metalized stack of FIGS. 7 and 8.

Referring to FIG. 9B, with the absence of a TiN layer between the Cu layer 110 and the upper Ti layer 182, copper from the Cu layer 110 is also able to reach the Au layer 174. Such an effect can result in discoloration (e.g., non-uniform patterns on the surfaces) of the M1 structure 180 and undesirable features such as wire bonding issues.

For the example metalized stack 160 of FIGS. 7 and 8, the first Ti layer 162 can be configured to provide functionalities such as adhesion and covering of surface irregularities due to, for example, roughness of the ohmic metal film 104. An example of how the first Ti layer 162 can be formed is described herein in greater detail. It will be understood that the thickness of the first Ti layer 162 can be less than or greater than the example thickness of approximately 1,000 angstroms. In some implementations, the thickness of the first Ti layer 162 can be selected to be sufficient to provide one or more of the foregoing functionalities.

For the example metalized stack 160 of FIGS. 7 and 8, the first TiN layer 164 can be configured to act as, for example, a barrier that reduces or inhibits migration of gold, copper and/or other atoms between the ohmic metal layer 104 and the Cu layer 110. An example of how the first TiN layer 164 can be formed is described herein in greater detail. It will be understood that the thickness of the first TiN layer 164 can be less than or greater than the example thickness of approximately 500 angstroms. In some implementations, the thickness of the first TiN layer 164 can be selected to be sufficient to provide one or more of the features as described herein.

For the example metalized stack 160 of FIGS. 7 and 8, the Cu layer 110 can be configured to, for example, yield a desired resistivity. Because the Cu layer 110 can be configured as a main conductive layer of the stack 160, the Cu layer's sectional dimensions (e.g., thickness and/or width) can be selected to provide a desired conductive property of the stack 160. In the example stack 160 of FIGS. 7 and 8, the approximately 25,000 angstrom Cu layer 110 was selected to provide a roughly same sheet resistance associated with an approximately 30,000 angstrom gold layer which the Cu layer 110 is replacing. An example of how the Cu layer 110 can be formed is described herein in greater detail. It will be understood that the thickness of the Cu layer 110 can be less than or greater than the example thickness of approximately 25,000 angstroms. In some implementations, the thickness of the Cu layer 110 can be selected to be sufficient to provide one or more of the features as described herein.

For the example metalized stack 160 of FIGS. 7 and 8, the second TiN layer 170 can be configured to, for example, reduce or inhibit some of the copper from the Cu layer 110 from reaching the Au layer 174 and yielding discoloration and wire bonding issues associated with the metalized structure. An example of how the second TiN layer 170 can be formed is described herein in greater detail. It will be understood that the thickness of the second TiN layer 170 can be less than or greater than the example thickness of approximately 500 angstroms. In some implementations, the thickness of the second TiN layer 170 can be selected to be sufficient to provide one or more of the features as described herein.

For the example metalized stack 160 of FIGS. 7 and 8, the Pt layer 172 can be configured to act as, for example, a barrier that reduces or inhibits migration of gold, copper and/or other atoms between the Au layer 174 and the Cu layer 110. An example of how the Pt layer 172 can be formed is described herein in greater detail. It will be understood that the thickness of the Pt layer 172 can be less than or greater than the example thickness of approximately 500 angstroms. In some implementations, the Pt layer 172 can be formed so as to have a thickness d5 that is at least approximately 250 angstroms. In some embodiments, the thickness d5 can be significantly larger than the example thickness of 250 angstroms. In some implementations, the thickness of the Pt layer 172 can be selected to be sufficient to provide one or more of the features as described herein.

For the example metalized stack 160 of FIGS. 7 and 8, the Au layer 174 can be configured to, for example, allow wire bonding of the metalized stack 160 and/or to protect the Cu layer 110 from oxidation. An example of how the Au layer 174 can be formed is described herein in greater detail. It will be understood that the thickness of the Au layer 174 can be less than or greater than the example thickness of approximately 1,200 angstroms. In some implementations, the thickness of the Au layer 174 can be selected to be sufficient to provide one or more of the features as described herein.

For the example metalized stack 160 of FIGS. 7 and 8, the second Ti layer 176 can be configured to, for example, provide a passivation layer for the Au layer 174, and/or to act as an adhesion layer for an additional passivation layer (e.g., a nitride layer) (e.g., 192 in FIG. 8A). An example of how the second Ti layer 176 can be formed is described herein in greater detail. It will be understood that the thickness of the second Ti layer 176 can be less than or greater than the example thickness of approximately 90 angstroms. In some implementations, the thickness of the second Ti layer 176 can be selected to be sufficient to provide one or more of the features as described herein.

In some implementations, a combination of layers that includes the first Ti layer 162 and the first TiN layer 164 can be configured to sufficiently reduce or prevent gold in the ohmic metal (104) from migrating to the Cu layer 110, and copper in the Cu layer 110 from diffusing into the ohmic metal (104). For a combination of layers that includes the second TiN layer 170, the Pt layer 172, and the Au layer 174, such a combination can be configured to sufficiently reduce or prevent migration and/or diffusion between the Cu layer 110 and the Au layer 174. Such a combination can also be configured to be sufficiently robust mechanically to be able to withstand stress of wire bonding and/or probing.

In the example configuration 160 of FIGS. 7 and 8, dimensions (e.g., thickness) of the various layers can be different than their respective example values listed in Table 2. For example, the first Ti layer (162) can have a thickness that is in a range of 50 to 5,000 angstroms, in a range of 100 to 4,000 angstroms, 200 to 3,000 angstroms, 500 to 2,000 angstroms, or 750 to 1,250 angstroms. In another example, the first TiN layer (164) can have a thickness that is in a range of 50 to 5,000 angstroms, in a range of 100 to 2,500 angstroms, 200 to 1,000 angstroms, 300 to 700 angstroms, or 400 to 600 angstroms. In yet another example, the Cu layer (110) can have a thickness that is in a range of 500 to 50,000 angstroms, in a range of 5,000 to 40,000 angstroms, 10,000 to 35,000 angstroms, or 20,000 to 30,000 angstroms. In yet another example, the second TiN layer (170) can have a thickness that is in a range of 50 to 5,000 angstroms, in a range of 100 to 2,500 angstroms, 200 to 1,000 angstroms, 300 to 700 angstroms, or 400 to 600 angstroms. In yet another example, the Pt layer (172) can have a thickness that is in a range of 50 to 5,000 angstroms, in a range of 100 to 2,500 angstroms, 200 to 1,000 angstroms, 300 to 700 angstroms, or 400 to 600 angstroms. In yet another example, the Au layer (174) can have a thickness that is in a range of 100 to 5,000 angstroms, in a range of 200 to 4,000 angstroms, 300 to 3,000 angstroms, 500 to 2,000 angstroms, or 900 to 1,500 angstroms. In yet another example, the second Ti layer (176) can have a thickness that is in a range of 20 to 500 angstroms, in a range of 40 to 300 angstroms, 60 to 200 angstroms, or 70 to 110 angstroms.

In some embodiments, some or all of the layers in the example configuration 160 of FIGS. 7 and 8 can be formed from different materials to provide similar functionalities. For example, the first Ti layer (162) can be substituted with materials such as chromium (Cr). In another example, the first TiN layer (164) can be substituted with materials such as any metal nitride that can be evaporated with ion assist. In yet another example, the Cu layer (110) can be substituted with materials such as aluminum (Al). In yet another example, the second TiN layer (170) can be substituted with materials such as any metal nitride that can be evaporated with ion assist. In yet another example, the Pt layer (172) can be substituted with materials such as palladium (Pd) or nickel (Ni). In yet another example, the second Ti layer (176) can be substituted with materials such as chromium (Cr).

In the example configuration 160 of FIGS. 7 and 8, the ohmic layer 104 is described as being formed from gold. It will be understood that other types of ohmic layer can also be implemented. For devices such as MESFET and pHEMT, the ohmic layer can be an N-ohmic layer. For N-type semiconductors, the ohmic layer can include nickel, germanium (or gold-germanium AuGe) and/or gold. Different variations of such materials can be utilized, including for example, Ni/Ge/Au, Ni/Au/Ge/Au, Ni/AuGe/Au, Ni/Au/Ge/Ni/Au, Ge/Ni/Au, and AuGe/Ni/Au. For devices such as HBT, BiFET, BiHEMT, the ohmic layer can be N-ohmic or P-ohmic. The P-ohmic type can have Au in the layer with other metals such as Pt and Pd. Other configurations are also possible.

Example 3

Figure 10:
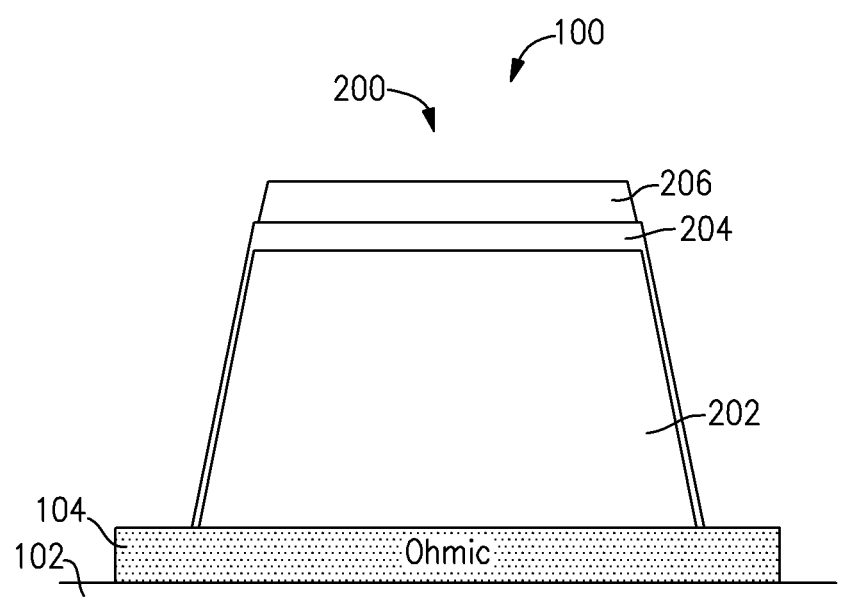
FIG. 10 schematically shows a third example configuration of the copper-based metal stack structure.

FIG. 10 schematically shows a third example configuration 200 of a copper-based metal stack structure 100. This particular example includes methods related to deposition of various layers, including the upper portion of the stack structure 200.

One of the challenges of a Cu M1 scheme is to prevent the top layers from failing. In the context of wire bonding based devices, the upper portion of an M1 stack generally needs to be able to handle the stress associated with wire bonding. In some situations, mechanical and/or ultrasonic forces associated with ball bonding can weaken a top barrier such as a Ti/Pt/Au combination. Film failure can originate from such a weakened site and propagate.

A sputtered refractory metal like TiW can function as a good barrier. However, a sputtered film typically cannot be lifted off successfully due to its conformal coating property. In some implementations, such a challenge associated with sputtered film and subsequent liftoff can be addressed by use of some types of resists, including those having a re-entrant profile. As described herein, a deposition of a relatively thick Cu layer (e.g., 25,000 angstroms) using a re-entrant profile can yield a change in a resist profile to make it possible to sputter a barrier metal such as TiW with little or no wings or stringers, to thereby facilitate an effective liftoff process.

By way of an example, FIG. 10 shows that the metal stack structure 200 that can result from the foregoing sputtering of a barrier (such as TiW) and a liftoff process thereafter. The metal stack structure 200 can include a copper stack 202 (e.g., including Ti/barrier/Cu/Ti) formed over an ohmic metal layer 104 which is formed over a substrate 102 such as GaAs. The metal stack structure 200 is shown to further includes a sputtered barrier layer 204 (such as TiW) formed over the copper stack 202. A gold layer 206 is shown to be formed over the sputtered barrier layer 204. Examples of how the copper stack 202, sputtered barrier layer 204, and the gold layer 206 can be formed are described herein in greater detail.

Figure 11:
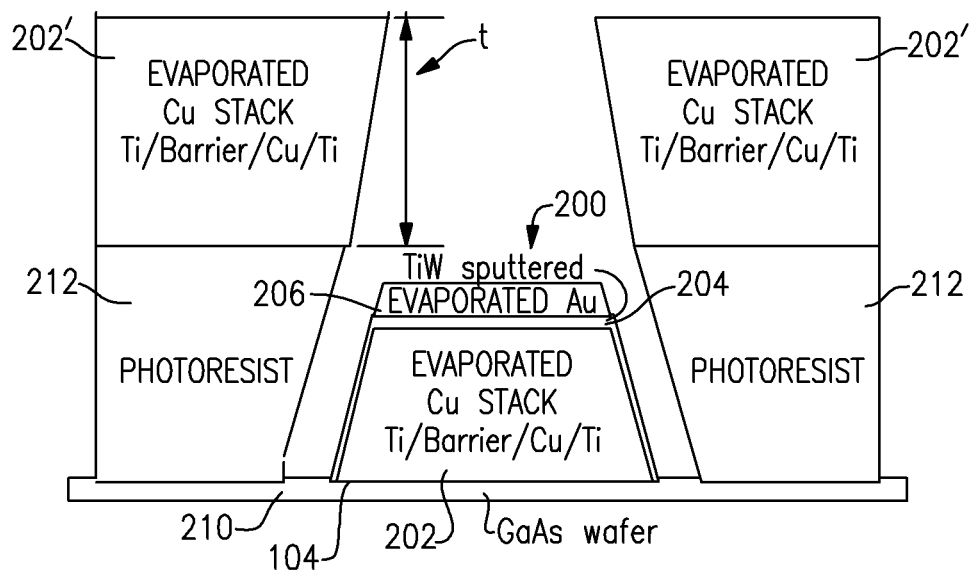
FIG. 11 shows a pre-liftoff stage that can be implemented to fabricate the example metal stack structure of FIG. 10.

FIG. 11 shows a pre-liftoff stage where the barrier layer (e.g. TiW) 204 has been sputtered on over the copper stack 202, and the gold layer 206 has been deposited over the barrier layer 204 by evaporation. A photoresist 212 is shown to have a re-entrant profile so as to define an opening for the formation of the copper stack 202. The photoresist 212 is shown to be formed over an ohmic metal layer 104 which is formed over a compound semiconductor substrate such as a GaAs wafer 210.

Figure 12:
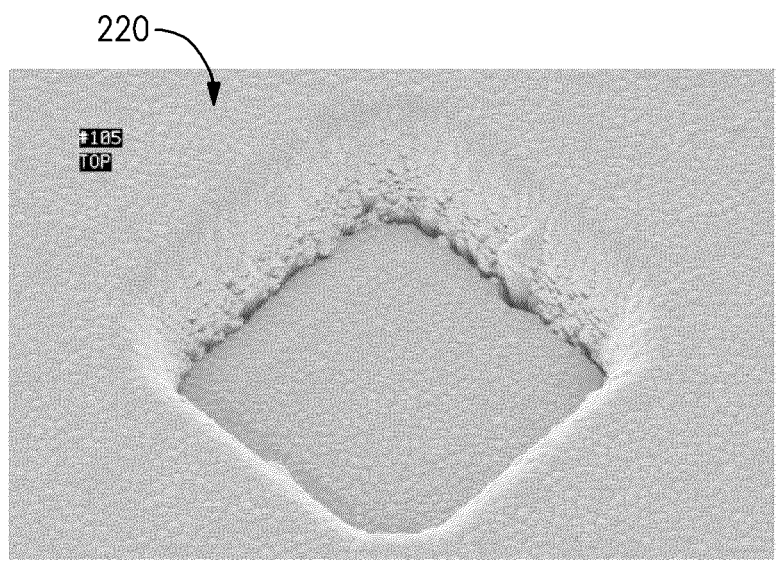
FIG. 12 shows an underside of a metal layer that has undergone a successful liftoff process.

As shown in FIG. 11, deposition of the copper stack 202 by, for example, evaporation results in a significant increase in resist liftoff height by "t" which is approximately the height of the copper stack 202' formed over the photoresist 212. For the first and second examples (120, 160) described herein, the added thickness "t" can be at least 25,000 angstroms. As further shown in FIG. 11, the evaporated copper stack 202' over the photoresist 212 can generally continue the re-entrant profile of the photoresist 212, thereby reducing the critical dimension of the opening through which the upper layers (e.g., 204, 206) will be formed. Such a reduction in the opening's critical dimension can reduce or substantially eliminate formation of wings during the sputtering of the TiW barrier layer 204. Such a sputtered TiW barrier 204 can further allow removal of the metal layer 202' by a liftoff process. FIG. 12 shows an underside of a metal layer 220 (such as the metal layer 202') that has undergone a successful liftoff process.

In some implementations, the copper stack 202 of FIGS. 10 and 11 can include the copper layer 110 of FIGS. 4 and 7, and any combination of below-copper layers and above-copper layers of the first and second example configurations 120, 160 of FIGS. 4 and 7. Dimensions and materials for such implementations can be similar to those described herein. In some implementations, one or more layers above the copper layer and/or one or more layers below the copper layer can be different from the examples described in reference to FIGS. 4 and 7.

In the example configuration 200 of FIGS. 10 and 11, the sputtered TiW layer (204) can have a thickness selected to provide desired barrier functionality and to facilitate removal of the metal layer 202' by a liftoff process.

Example Method for Fabrication of the First Example Metal Stack

Figure 13:
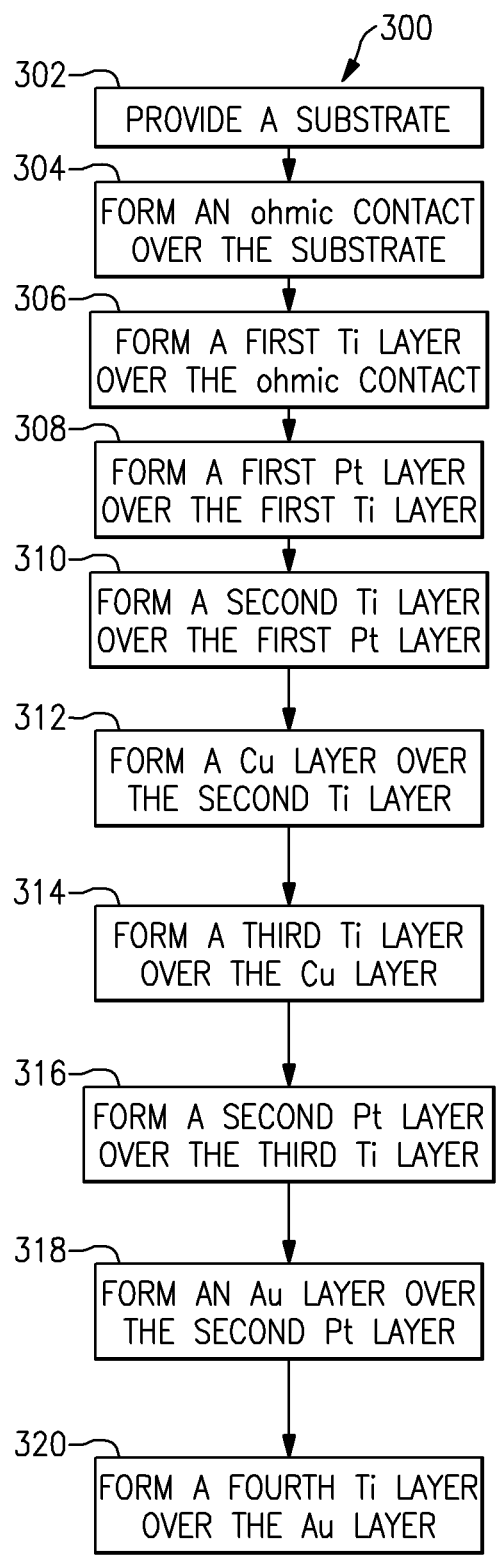
FIG. 13 shows a process that can be implemented to fabricate the first example metal stack of FIGS. 4 and 5.
Figure 14:
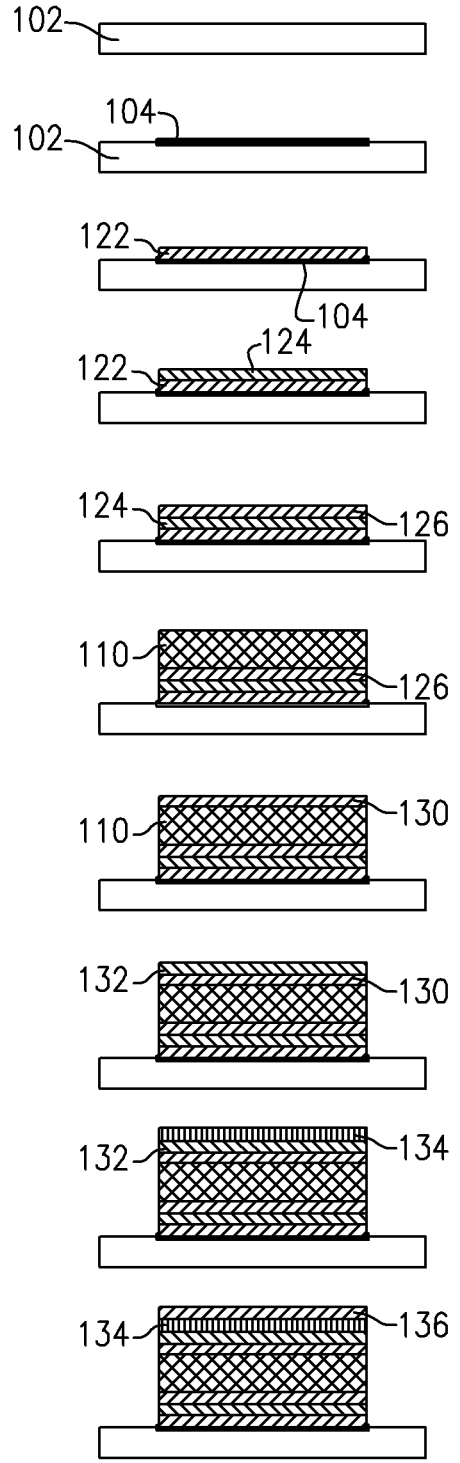
FIG. 14 shows various stages of the example fabrication process of FIG. 13.

FIG. 13 shows a process 300 that can be implemented to fabricate the example metal stack 120 of FIGS. 4 and 5. FIG. 14 shows various stages of fabrication of the metal stack 120. In block 302, a compound semiconductor substrate (102) such as GaAs can be provided. In block 304, an ohmic contact (104) can be formed over the substrate (102). In some implementations, the ohmic contact layer (104) can be formed in a known manner.

In block 306, a first Ti layer (122) can be formed over the ohmic contact layer (104). In some implementations, the first Ti layer (122) can be formed by an electron-beam evaporation deposition process. In some implementations, such a deposition can start at a vacuum of about $7.5 \times 10^{-6}$ Torr; and deposition rates can be between about 5 to 15 angstroms/sec. A circular beam sweep pattern of about 2 revolutions per second, as well as a static beam configuration can be used. This deposition step can be performed without a crucible. Other deposition methods and configurations can also be utilized.

In block 308, a first Pt layer (124) can be formed over the first Ti layer (122). In some implementations, the first Pt layer (124) can be formed by an electron-beam evaporation deposition process. In some implementations, such a deposition can be performed so as to yield an evaporation rate of about 3 angstroms/sec without a beam sweep. Other deposition methods and configurations can also be utilized.

In block 310, a second Ti layer (126) can be formed over the first Pt layer (124). In some implementations, the second Ti layer (126) can be formed by an electron-beam evaporation deposition process similar to that associated with the first Ti layer (122). Other deposition methods and configurations can also be utilized.

In block 312, a Cu layer (110) can be formed over the second Ti layer (126). In some implementations, the Cu layer (110) can be formed by an electron-beam evaporation deposition process. In some implementations, a relatively long cool down time can be provided to ensure the source material is sufficiently cool before venting the chamber for service or to add metal. A tungsten (W) or molybdenum (Mo) crucible can be used for the evaporation of Cu. Use of such a liner can provide advantageous features such as reducing thermal contact to the hearth (which is water cooled in some situations), thereby allowing a higher deposition rate for a given beam power. In some implementations, a deposition rate of about 8 to 20 angstroms/sec can be achieved with little or no signs of spitting which is a problem commonly associated with evaporated gold. Other deposition methods and configurations can also be utilized.

In block 314, a third Ti layer (130) can be formed over the Cu layer (110). In some implementations, the third Ti layer (130) can be formed by an electron-beam evaporation deposition process similar to that associated with the first Ti layer (122). Other deposition methods and configurations can also be utilized.

In block 316, a second Pt layer (132) can be formed over the third Ti layer (130). In some implementations, the second Pt layer (132) can be formed by an electron-beam evaporation deposition process similar to that associated with the first Pt layer (124). Other deposition methods and configurations can also be utilized.

In block 318, an Au layer (134) can be formed over the second Pt layer (132). In some implementations, the Au layer (134) can be formed by an electron-beam evaporation deposition process. Other deposition methods and configurations can also be utilized.

In block 320, a fourth Ti layer (136) can be formed over the Au layer (134). In some implementations, the fourth Ti layer (136) can be formed by an electron-beam evaporation deposition process similar to that associated with the first Ti layer (122). Other deposition methods and configurations can also be utilized.

In some implementations, a portion of the third Ti layer (130) can be formed (e.g., about 100 angstroms) so as to cap the Cu layer (110) of a wafer. Thereafter, the wafer can be processed further in a different evaporator for deposition of the remaining layers (e.g., about 400 angstroms of the third Ti layer, about 500 angstroms of the second Pt layer, about 1,200 angstroms of the Au layer, and about 90 angstroms of the fourth Ti layer).

Example Method for Fabrication of the Second Example Metal Stack

Figure 15:
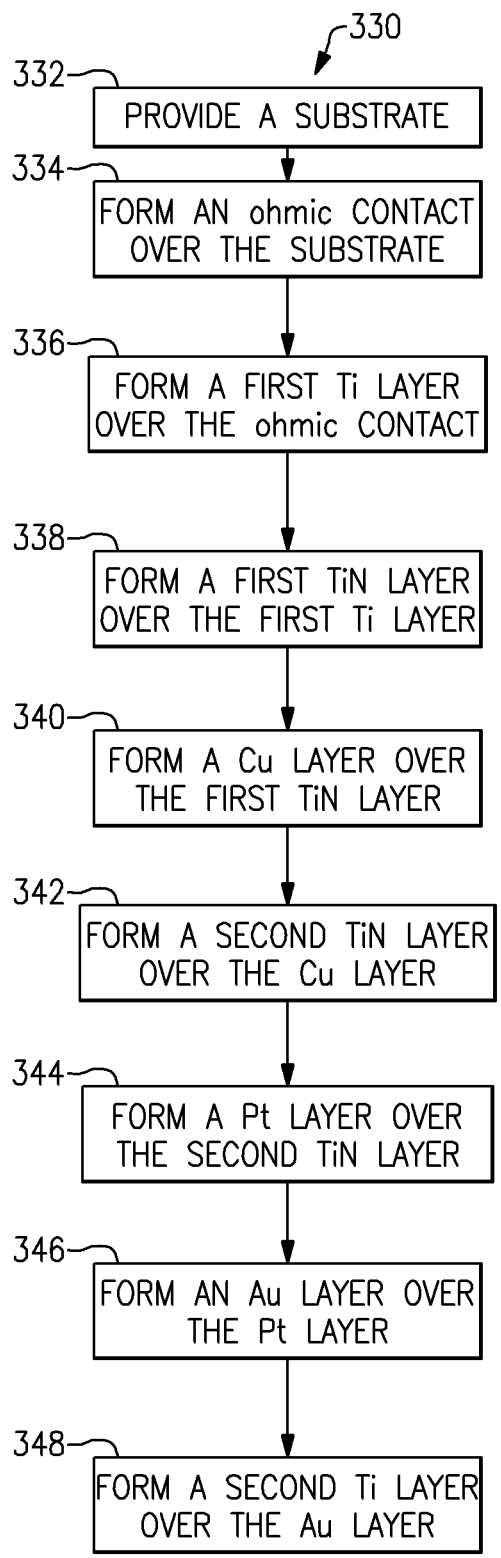
FIG. 15 shows a process that can be implemented to fabricate the first example metal stack of FIGS. 7 and 8.
Figure 16:
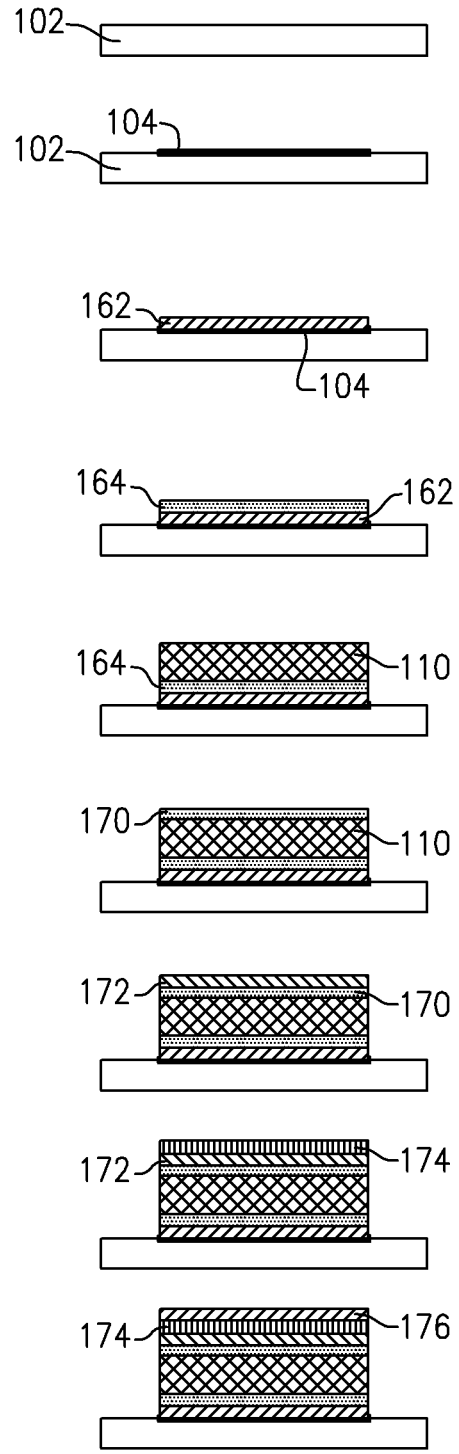
FIG. 16 shows various stages of the example fabrication process of FIG. 15.

FIG. 15 shows a process 330 that can be implemented to fabricate the example metal stack 160 of FIGS. 7 and 8. FIG. 16 shows various stages of fabrication of the metal stack 160. In block 332, a compound semiconductor substrate (102) such as GaAs can be provided. In block 334, an ohmic contact (104) can be formed over the substrate (102). In some implementations, the ohmic contact layer (104) can be formed in a known manner.

In block 336, a first Ti layer (162) can be formed over the ohmic contact layer (104). In some implementations, the first Ti layer (162) can be formed by an electron-beam evaporation deposition process. In some implementations, such a deposition can start at a vacuum of about $7.5 \times 10^{-6}$ Torr; and deposition rates can be between about 5 to 15 angstroms/sec. A circular beam sweep pattern of about 2 revolutions per second, as well as a static beam configuration can be used. This deposition step can be performed without a crucible. Other deposition methods and configurations can also be utilized.

In block 338, a first TiN layer (164) can be formed over the first Ti layer (162). In some implementations, an ion assist technique can be utilized to form a $TiN_x$ layer. Such a technique of using ion assist evaporation can yield a $Ti_xN_y$ film (which is typically sputtered reactively). To achieve such an ion assisted evaporation process, the following example can be implemented. A chamber vacuum of about $7.5 \times 10^{-7}$ Torr can be provided. Nitrogen (N2) can be bled into the chamber until the chamber pressure reaches about $5 \times 10^{-5}$ Torr. Deposition rate of about 2.5 angstroms/sec can be achieved using an ion source power of about 1,000 V at about 20 mA. Higher ion gun power and other deposition techniques can also be utilized. In some embodiments, ion assisted evaporation of TiN can yield a densified barrier film that is more resistant to failures. Other deposition methods and configurations can also be utilized.

In block 340, a Cu layer (110) can be formed over the first TiN layer (164). In some implementations, the Cu layer (110) can be formed by an electron-beam evaporation deposition process. In some implementations, a relatively long cool down time can be provided to ensure the source material is sufficiently cool before venting the chamber for service or to add metal. A tungsten (W) or molybdenum (Mo) crucible can be used for the evaporation of Cu. Use of such a liner can provide advantageous features such as reducing thermal contact to the hearth (which is water cooled in some situations), thereby allowing a higher deposition rate for a given beam power. In some implementations, a deposition rate of about 8 to 20 angstroms/sec can be achieved with little or no signs of spitting which is a problem commonly associated with evaporated gold. Other deposition methods and configurations can also be utilized.

In block 342, a second TiN layer (170) can be formed over the Cu layer. In some implementations, the second TiN layer (170) can be formed in a manner similar to that of the first TiN layer (164). Other deposition methods and configurations can also be utilized.

In block 344, a Pt layer (172) can be formed over the second TiN layer (170). In some implementations, the Pt layer (172) can be formed by an electron-beam evaporation deposition process. In some implementations, the Pt layer (172) can be formed in a manner similar to the example described in reference to block 308 of FIG. 13. Other deposition methods and configurations can also be utilized.

In block 346, an Au layer (174) can be formed over the Pt layer (172). In some implementations, the Au layer (174) can be formed by an electron-beam evaporation deposition process. In some implementations, the Au layer (174) can be formed in a manner similar to the example described in reference to block 318 of FIG. 13. Other deposition methods and configurations can also be utilized.

In block 348, a second Ti layer (176) can be formed over the Au layer (174). In some implementations, the second Ti layer (176) can be formed by an electron-beam evaporation deposition process similar to the example associated with the first Ti layer (162). Other deposition methods and configurations can also be utilized.

Example Method for Fabrication of the Third Example Metal Stack

Figure 17A:
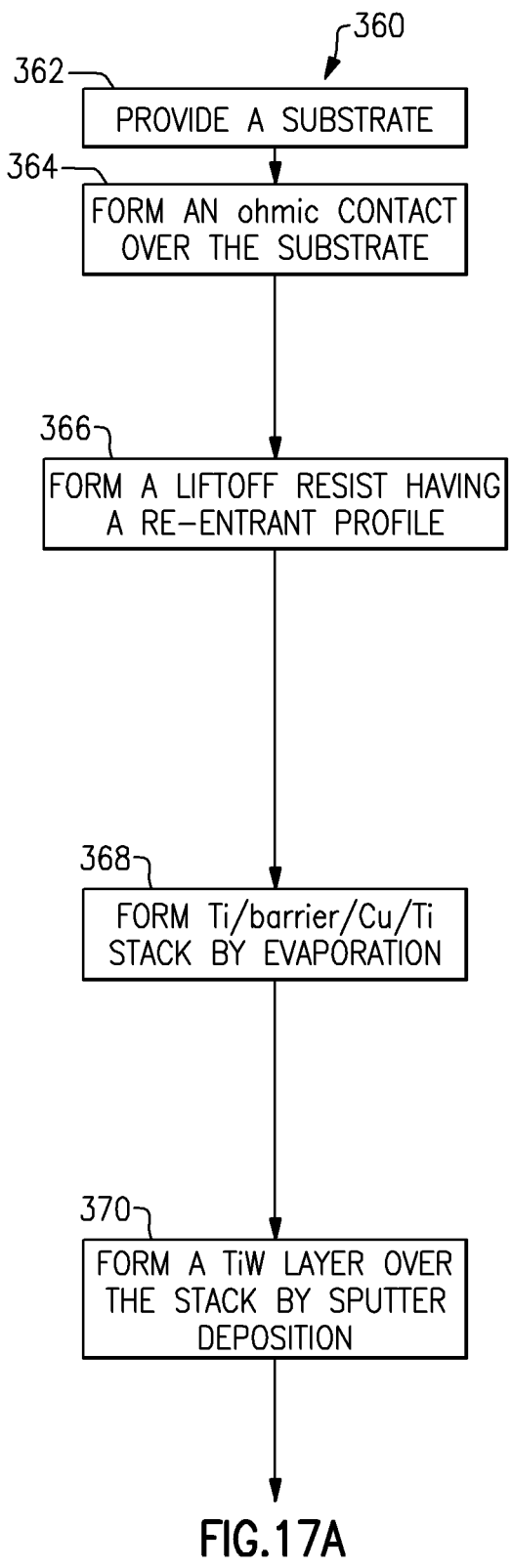
Figure 18A:
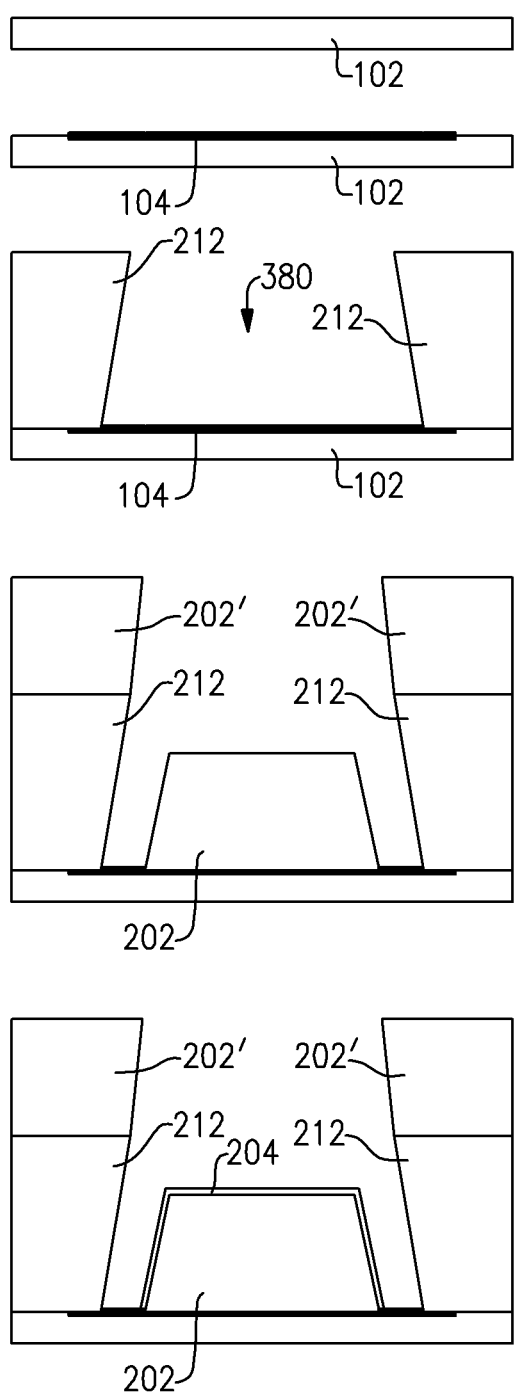

FIGS. 17A and 17B show a process 360 that can be implemented to fabricate the example metal stack 200 of FIGS. 10 and 11. FIG. 18 shows various stages of fabrication of the metal stack 200. In block 362, a compound semiconductor substrate (102) such as GaAs can be provided. In block 364, an ohmic contact (104) can be formed over the substrate (102). In some implementations, the ohmic contact layer (104) can be formed in a known manner.

In block 366, a liftoff resist (212) having a re-entrant profile can be formed over the substrate (102) and a portion of the ohmic contact layer (104). In some implementations, such a liftoff resist can be formed utilizing a known technique.

In block 368, a copper stack having at least a lower barrier can be formed. Formation of such a copper stack can yield a trapezoid shaped stack 202 inside the re-entrant profile opening, and a stack 202' above the resist layer 212. The copper stack 202' above the resist layer 212 can yield an increased liftoff height, as well as a reduced critical dimension of the re-entrant opening. In some implementations, the copper stack (202, 202') can be based on one or any combination of the examples described herein. In some implementations, the copper stack (202, 202') can include a combination of layers having Ti, barrier, Cu, and Ti layers; and such a stack can be formed by evaporation. Other deposition methods and configurations can also be utilized.

In block 370, a TiW layer can be formed over the copper stack (202, 202') by sputter deposition. Such a sputter deposition can yield a TiW layer 204 over the copper stack 202. In some implementations, the reduced critical dimension of the re-entrant profile opening can allow the sputtered TiW layer 204 to form with little or no wings or stringers, to thereby allow liftoff of the metal stack 202'. Other deposition methods and configurations can also be utilized.

In block 372, an Au layer (206) can be formed over the TiW layer (204). In some implementations, the Au layer (206) can be formed by an electron-beam evaporation deposition process. In some implementations, the Au layer (206) can be formed in a manner similar to the example described in reference to block 318 of FIG. 13. Other deposition methods and configurations can also be utilized.

In block 374, the metal stack (202') above the resist layer (212) can be removed by a liftoff process. In some implementations, such a liftoff process can be achieved in a known manner.

Performance of the Example Metal Stacks

Each of the three example configurations described herein (120 in FIGS. 4 and 5, 160 in FIGS. 7 and 8, and 200 in FIGS. 10 and 11) passed a 3-week bake test. More specifically, wafers having Cu M1 structures according to the foregoing configurations were kept in a convection oven at about 225° C. for three weeks, and the resulting Cu M1 structures showed no noticeable discoloration.

The first example configuration (120 in FIGS. 4 and 5) was further subjected to a high temperature operating life (HTOL) test which is typically a standard reliability test, and is much more demanding than the foregoing bake test.

Wafers having Cu M1 structures according to the first example configuration (120 in FIGS. 4 and 5) were subjected to a protracted duration under an elevated temperature. Such Cu M1 structures were associated with 2×230 μm single-gate pHEMT devices, and such devices were placed on a hot chuck (temperature of approximately 200° C.) and biased. The resulting bias yielded a device temperature of approximately 273° C. More particularly, Vds of about 5.0 V and Ids of about 35 mA (stressed as 1×230 μm gate) resulted in Tchannel=273° C.

In some situations, a zero failure of devices at the foregoing stress conditions at 500 hours implies a reliable operation (failure rate of 0.1% or less) for at least $10^4$ hours of use when operated at Tchannel=125° C.

Figure 19:
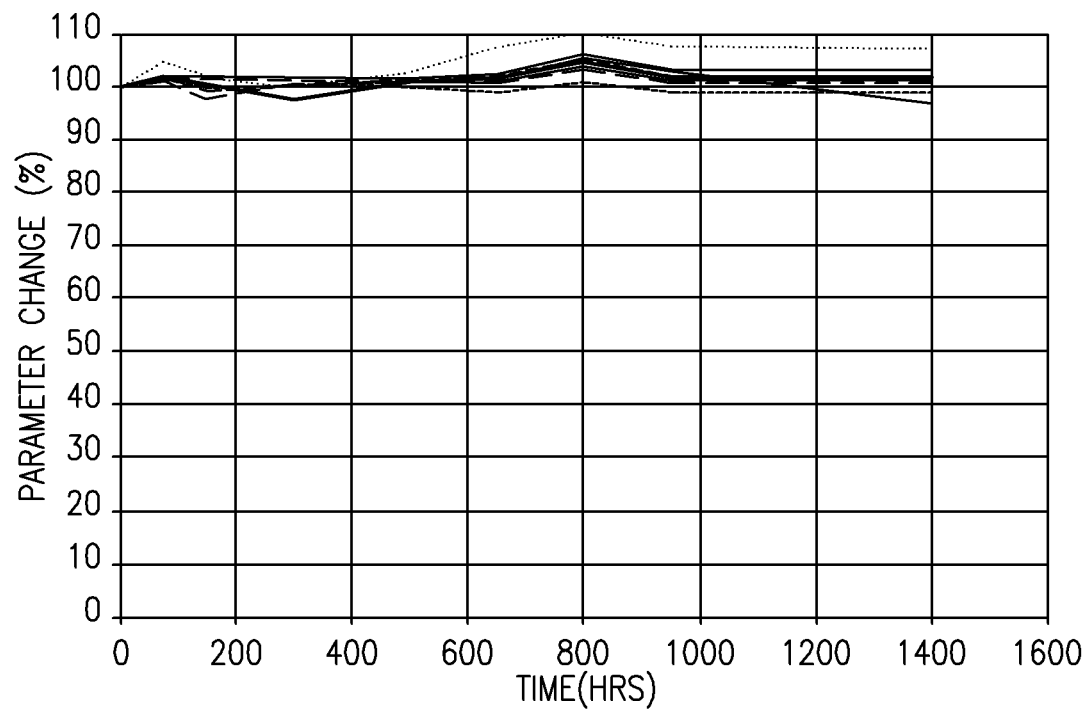
FIG. 19 shows an example of high temperature operating life (HTOL) test performance for samples of the metallization structure of FIGS. 4 and 5.

FIG. 19 shows plots of parameter (saturation current Idss) change (in %) for nine different samples having the first example configuration (120 in FIGS. 4 and 5), where Idss was measured for each sample over time. As shown, none of the nine samples showed any significant degradation in Idss for at least 1,400 hours which is far longer than the foregoing standard HTOL duration of 500 hours.

Based at least on the foregoing, copper-based metalized structures having one or more features as described herein can be configured to substantially survive a high temperature operating life (HTOL) test at approximately 200° C. for at least 100 hours, 200 hours, 500 hours, 1,000 hours, or 1,400 hours.

Figure 20:
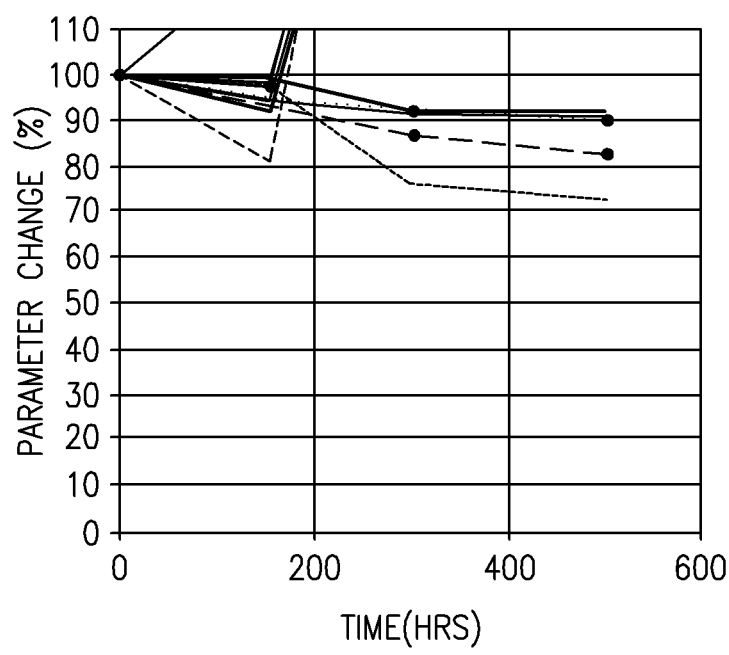
FIG. 20 shows an example of HTOL test failure for samples that do not have the barrier functionalities of the metallization structure of FIGS. 4 and 5.

FIG. 20 shows plots of the same parameter (saturation current Idss) change (in %) for a number of samples (e.g., FIGS. 6A and 6B) that do not have the barrier functionalities of the first example configuration (120 in FIGS. 4 and 5). Such barrier-less samples are shown to fail before a first read point, usually after about 48 hours of stress.

Figure 21:
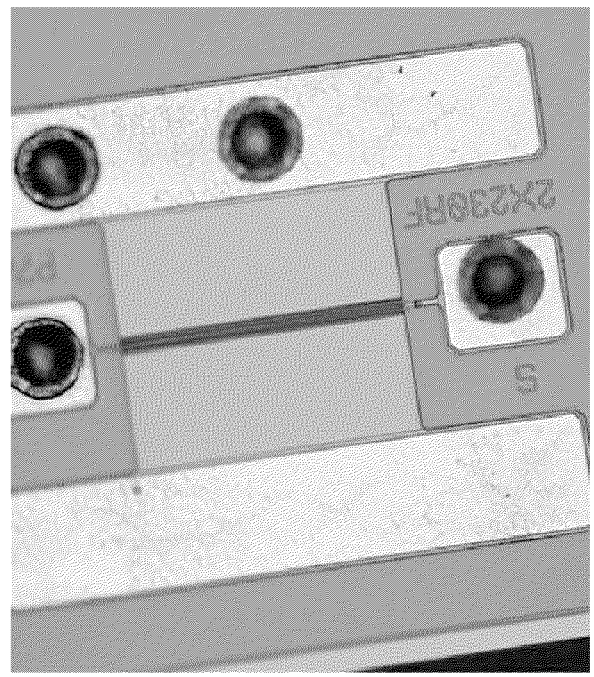
FIG. 21 shows an optical image of the metallization structure on one of the samples of FIG. 19, after 1,400 hours of the HTOL test.

FIG. 21 shows an optical image (plan view) of the M1 Cu structures on one of the samples of FIG. 19, after 1,400 hours of the HTOL stress. One can see that there is no noticeable signs of diffusion on the M1 Cu structures.

Figure 22:
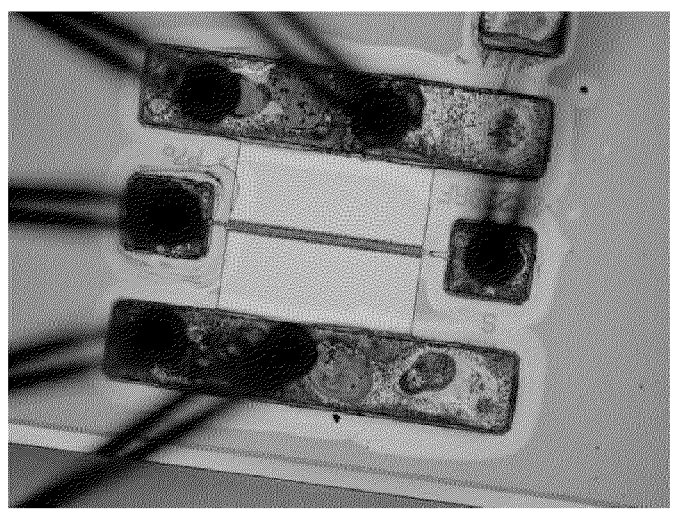
FIG. 22 shows an optical image of the metallization structure on one of the samples of FIG. 20, after failing the HTOL test.

In contrast, FIG. 22 shows an optical image (plan view) that is similar to the image of FIG. 6B, of the copper structures on one of the samples of FIG. 20, after failing the HTOL stress test. As in FIG. 6B, the copper structures show significant discoloration resulting from, for example, diffusion.

The foregoing failed devices of FIGS. 20 and 22 also include significant voids in the copper layer when viewed with, for example, a focused ion beam (FIB) imager. Such voids and related failures can be similar to those described in reference to FIG. 9A.

In some embodiments, metalized structures having one or more features as described herein can be implemented in a compound semiconductor wafer, which in turn can yield a plurality of dies. Each of such dies can include an integrated circuit configured to perform a number of functions. FIG. 23 shows a process 400 that can be implemented to fabricate a die (410 in FIG. 24) having one or more metalized structures 100 as described herein. In block 402, one or more semiconductor structures (412 in FIG. 24) can be formed on a compound semiconductor substrate such as GaAs. In block 404, one or more M1 stacks having copper can be formed for such structures. In block 406, a die having an integrated circuit that includes the M1 metalized semiconductor structures can be formed. Although described in the context of metalizing semiconductor structures (412), it will be understood that copper-based metal stacks having one or more features as described herein can also be implemented in other portions (such as a passive device 414) of the die 410.

In some embodiments, a die having one or more copper-based metalized stacks as described herein can be implemented in a module. FIG. 25A shows an example of such a module 420, and FIG. 25B shows a block diagram representation of the same.

The module 420 can include a die 410 such as the die described in reference to FIGS. 23 and 24. Such a die can be mounted on a packaging substrate 422, and can be protected by an overmold structure 425. Electrical connections to and from the die 410 can be facilitated by connections 426 such as wirebonds. Such wirebonds can be interconnected to connection pads 428 formed on the module so as to facilitate connectivity to other modules and/or external components.

In some embodiments, the module 420 can also include one or more surface-mount devices (SMD) mounted on the packaging substrate 422 and configured to facilitate and/or complement the functionality of the integrated circuits in the die 410. In some embodiments, the module 420 can also include one or more packaging structures to, for example, provide protection and facilitate easier handling of the module 420. Such a packaging structure can include an overmold formed over the packaging substrate 422 and dimensioned to substantially encapsulate the various circuits and components thereon.

It will be understood that although the module 420 is described in the context of wirebond-based electrical connections, one or more features of the present disclosure can also be implemented in other packaging configurations, including flip-chip configurations.

In some embodiments, a module or a die having one or more copper-based metalized stacks as described herein can be implemented in a radio-frequency (RF) device. FIG. 26 shows an example of such an RF device 430.

The RF device 430 can include a module 420 such as the module described in reference to FIGS. 25A and 25B, and/or an unpackaged die such as the die 410 described in reference to FIG. 24. In some implementations, such a module can facilitate operation of a transmit/receive circuit 432 and an antenna 434. In some embodiments, the module 420 can be configured to provide, for example, amplification of RF signals, switching of RF signals, and/or other RF related functions.

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 27:
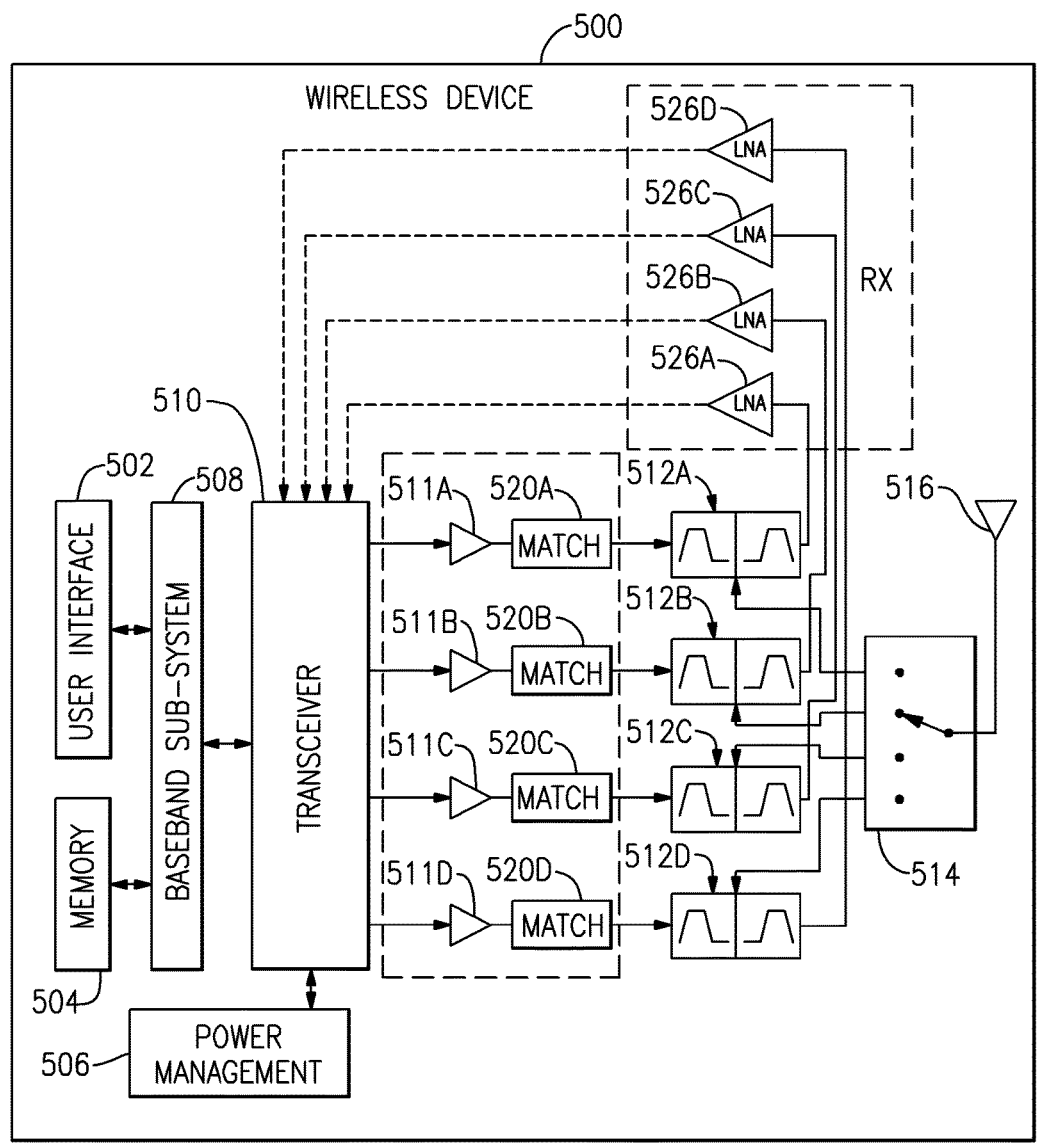
FIG. 27 shows a more specific example of the RF device of FIG. 26 implemented as a wireless device.

FIG. 27 schematically depicts an example wireless device 500 having one or more advantageous features described herein. In the example wireless device 500, one or more low-noise amplifiers (LNAs) 526 are shown to receive RF signals from an antenna 516 through a switch 514 and their respective duplexers 512. Such LNAs and related channels can facilitate, for example, multi-band operation of the wireless device 500.

The LNAs 526 are shown to pass their amplified signals to a transceiver 510 for further processing by a receiver circuit (not shown). The transceiver 510 can also generate RF signals for transmission and pass such signals to power amplifiers (PAs) 511. Outputs of the PAs 511 are shown to be matched (via match circuits 520) and routed to the antenna 516 via their respective duplexers 512a-512d and the band-selection switch 514. The band-selection switch 514 can include, for example, a single-pole-multiple-throw (e.g., SP4T) switch to allow selection of an operating band (e.g., Band 2). In some embodiments, each duplexer 512 can allow transmit and receive operations to be performed simultaneously using a common antenna (e.g., 516).

The transceiver 510 is also shown to interact with a baseband sub-system 508 that is configured to provide conversion between data and/or voice signals suitable for a user and RF signals suitable for the transceiver 510. The transceiver 510 is also shown to be connected to a power management component 506 that is configured to manage power for the operation of the wireless device. Such power management can also control operations of the baseband sub-system 508 and other components.

The baseband sub-system 508 is shown to be connected to a user interface 502 to facilitate various input and output of voice and/or data provided to and received from the user. The baseband sub-system 508 can also be connected to a memory 504 that is configured to store data and/or instructions to facilitate the operation of the wireless device, and/or to provide storage of information for the user.

In some implementations, M1 Cu contacts or interconnects having one or more features as described herein can be implements in a number of components in the example wireless device 500. For example, the power amplifiers 511 and the switch 514 are non-limiting examples of components that can include one or more M1 Cu structures. In another example, a component that includes any device that has or be connected with an M1 gold contact can benefit by having the gold replaced by copper as described herein.

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

In the context of wireless devices, pseudomorphic high electron mobility transistor (pHEMT), metal semiconductor field effect transistor (MESFET), heterojunction bipolar transistor (HBT), bipolar FET (BiFET), bipolar HEMT (BiHEMT), and surface acoustic wave (SAW) device (e.g., SAW filter or resonator) are examples of semiconductor devices that can include or be connected with Cu M1 structures having one or more features as described herein. It will be understood that other semiconductor devices utilized in wireless devices can also benefit from such Cu M1 structures.

It will also be understood that semiconductor devices associated with other types of electronic devices can also benefit from Cu M1 structures having one or more features as described herein. By way of non-limiting examples, electrical contacts and/or interconnects associated with devices such as Mach-Zehnder (MZ) modulator, photovoltaic device, light-emitting diode (LED), laser diode such as vertical cavity laser (VCSEL) diode, etc. can utilize one or more Cu M1 structures as a substitute for more costly structures such as gold M1 structures.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A method for forming a metalized structure for a compound semiconductor device, the method comprising:
    forming a resist mask that defines an opening over a substrate associated with the compound semiconductor device;
    forming a stack within the opening and over the substrate, the stack including an ohmic metal layer, a barrier disposed over the ohmic metal layer, and a copper layer disposed over the barrier, the barrier including a first titanium layer, a barrier layer disposed over the first titanium layer, and a second titanium layer disposed over the barrier layer and a copper (Cu) layer formed over the barrier layer; and
    sputtering a titanium tungsten (TiW) layer over the stack and at least partially covering a to surface and a side surface of the stack in a manner that allows the resist mask to be removed by a liftoff process.

2. The method of claim 1 wherein the resist mask has a re-entrant profile at the opening.

3. The method of claim 2 wherein forming of the stack further includes forming a third titanium (Ti) layer between the copper Cu layer and the titanium tungsten TiW layer.

4. The method of claim 3 further comprising forming a gold (Au) layer over the titanium tungsten TiW layer.

5. The method of claim 4 further comprising forming a fourth titanium layer over the bold layer.

6. The method of claim 5 further comprising lifting off the resist mask to thereby yield a trapezoid shaped stack.

7. The method of claim 1 wherein the barrier layer includes platinum (Pt), palladium (Pd), or nickel (Ni).

8. The method of claim 1 wherein the substrate is gallium arsenide GaAs.

9. The method of claim 1 wherein the titanium tungsten TiW layer is formed without wings or stringers.

10. The method of claim 1 wherein the titanium tungsten layer covers the entirety of the upper surface and the side surface of the stack.

11. The method of claim 1 wherein the titanium tungsten layer permanently covers the stack.

12. The method of claim 1 wherein the first titanium layer and the second titanium layer are titanium-only layer.

13. A method of forming a radiofrequency device, the method comprising:
    forming an ohmic contact layer of a substrate;
    forming a liftoff resist having a re-entrant profile over the substrate and at least a portion of the ohmic contact layer;
    forming a stack within the opening and over the substrate by evaporation, the stack including a barrier layer disposed over the ohmic contact layer and a copper (Cu) layer formed over the barrier layer, the barrier including a first titanium layer, a barrier layer disposed over the first titanium layer, and a second titanium layer disposed over the barrier layer; and
    sputtering a titanium tungsten (TiW) layer over the stack and at least partially covering a to surface and a side surface of the stack;
    forming a gold (Au) layer over the titanium tungsten layer by evaporation;
    performing a lift off procedure on the stack; and
    electrically connecting the stack.

14. The method of claim 13 wherein the radiofrequency device is an antenna.

15. The method of claim 13 wherein the radiofrequency device is a wireless device.

16. The method of claim 3 wherein the substrate is a pallium arsenide GaAs substrate and the barrier layer includes platinum (Pt), palladium (Pd), or nickel (Ni).

17. A method of forming a semiconductor device, the method comprising: providing a substrate for the semiconductor device;
    forming a resist mask that defines an opening over the substrate; forming a stack within the opening and over the substrate, the stack including an ohmic metal layer, a barrier layer formed over the ohmic metal layer, and a copper (Cu) layer formed over the barrier layer, the barrier including a first titanium layer, a barrier layer disposed over the first titanium layer, and a second titanium layer disposed over the barrier layer; and
    sputtering a titanium tungsten (TiW) layer over the stack and at least partially covering a to surface and a side surface of the stack in a manner that allows the resist mask to be removed by a liftoff process to form a metalized stack for the semiconductor device.

18. The method of claim 17 wherein the semiconductor device includes a pseudomorphic high electron mobility transistor (pHEMT), a metal semiconductor field effect transistor (MESFET), a heterojunction bipolar transistor (HBT), a Mach-Zehnder (MZ) modulator, a photovoltaic device, a light-emitting diode (LED), a bipolar FET (BiFET), a bipolar HEMT (BiHEMT), a laser diode, or a surface acoustic wave (SAW).

19. The method of claim 17 wherein the substrate is a gallium arsenide GaAs wafer.

20. The method of claim 17 wherein the stack is trapezoidal.

\* \* \* \* \*

UNITED STATES PATENT AND TRADEMARK OFFICE
CERTIFICATE OF CORRECTION

| | | |
|---|---|---|
| PATENT NO. | : 9,576,906 B2 | Page 1 of 1 |
| APPLICATION NO. | : 15/224993 | |
| DATED | : February 21, 2017 | |
| INVENTOR(S) | : Kezia Cheng | |

It is certified that error appears in the above-identified patent and that said Letters Patent is hereby corrected as shown below:

In the Specification

In Column 16 at Line 64, Change "1200 A" to --1200A--.

In the Claims

In Column 27 at Line 65, In Claim 1, change "to" to --top--.

In Column 28 at Line 9, In Claim 5, change "bold" to --gold--.

In Column 28 at Line 39, In Claim 13, change "to" to --top--.

In Column 28 at Line 49, In Claim 16, change "claim 3" to --claim 13--.

In Column 28 at Line 50, In Claim 16, change "pallium" to --gallium--.

In Column 28 at Line 64, In Claim 17, change "to" to --top--.

Signed and Sealed this
Nineteenth Day of June, 2018

Andrei Iancu
*Director of the United States Patent and Trademark Office*